US009705477B2

(12) United States Patent
Velazquez

(10) Patent No.: US 9,705,477 B2
(45) Date of Patent: Jul. 11, 2017

(54) COMPENSATOR FOR REMOVING NONLINEAR DISTORTION

(71) Applicant: Innovation Digital, LLC, San Diego, CA (US)

(72) Inventor: Scott R. Velazquez, San Diego, CA (US)

(73) Assignee: Innovation Digital, LLC, San Diego, CA (US)

(*) Notice: Subject to any disclaimer, the term of this patent is extended or adjusted under 35 U.S.C. 154(b) by 0 days.

(21) Appl. No.: 14/845,242

(22) Filed: Sep. 3, 2015

(65) Prior Publication Data

US 2016/0191020 A1 Jun. 30, 2016

Related U.S. Application Data

(63) Continuation-in-part of application No. 13/915,484, filed on Jun. 11, 2013, now Pat. No. 9,160,310, and (Continued)

(51) Int. Cl.
*H03M 1/06* (2006.01)
*H03H 21/00* (2006.01)
(Continued)

(52) U.S. Cl.
CPC ....... *H03H 21/0067* (2013.01); *H03F 1/3247* (2013.01); *H04L 25/02* (2013.01);
(Continued)

(58) Field of Classification Search
CPC ........ G11B 20/10009; G11B 20/10046; G11B 20/10037; G11B 20/10333; G11B 5/09;
(Continued)

(56) References Cited

U.S. PATENT DOCUMENTS 5,400,365 A * 3/1995 Tulai ............... H04L 27/1566
375/334
6,449,110 B1 9/2002 DeGroat et al.
(Continued)

*Primary Examiner* — Lam T Mai
(74) *Attorney, Agent, or Firm* — San Diego IP Law Group LLP; Trevor Coddington

(57) ABSTRACT

The present invention is a computationally-efficient compensator for removing nonlinear distortion. The compensator operates in a digital post-compensation configuration for linearization of devices or systems such as analog-to-digital converters and RF receiver electronics. The compensator also operates in a digital pre-compensation configuration for linearization of devices or systems such as digital-to-analog converters, RF power amplifiers, and RF transmitter electronics. The compensator effectively removes nonlinear distortion in these systems in a computationally efficient hardware or software implementation by using one or more factored multi-rate Volterra filters. Volterra filters are efficiently factored into parallel FIR filters and only the filters with energy above a prescribed threshold are actually implemented, which significantly reduces the complexity while still providing accurate results. For extremely wideband applications, the multi-rate Volterra filters are implemented in a demultiplexed polyphase configuration which performs the filtering in parallel at a significantly reduced data rate. The compensator is calibrated with an algorithm that iteratively subtracts an error signal to converge to an effective compensation signal. The algorithm is repeated for a multiplicity of calibration signals, and the results are used with harmonic probing to accurately estimate the Volterra filter kernels. The compensator improves linearization processing performance while significantly reducing the computational complexity compared to a traditional nonlinear compensator.

15 Claims, 19 Drawing Sheets

Related U.S. Application Data a continuation-in-part of application No. 13/455,071, filed on Apr. 24, 2012, now Pat. No. 8,582,694, which is a continuation-in-part of application No. 12/908,783, filed on Oct. 20, 2010, now Pat. No. 8,164,496, which is a continuation of application No. 12/817,075, filed on Jun. 16, 2010, now Pat. No. 7,940,198, which is a continuation-in-part of application No. 12/112,380, filed on Apr. 30, 2008, now Pat. No. 7,782,235.

(60) Provisional application No. 61/658,116, filed on Jun. 11, 2012.

(51) Int. Cl.
| | | |
|---|---|---|
| *H03F 1/32* | (2006.01) | |
| *H04L 25/02* | (2006.01) | |
| *H04L 25/14* | (2006.01) | |
| *H04L 27/26* | (2006.01) | |
| *H04L 27/00* | (2006.01) | |
| *H03M 1/12* | (2006.01) | |
| *H03M 1/66* | (2006.01) | |

(52) U.S. Cl.
CPC ............ *H04L 25/14* (2013.01); *H04L 27/265* (2013.01); *H03M 1/0612* (2013.01); *H03M 1/12* (2013.01); *H03M 1/66* (2013.01); *H04L 27/0006* (2013.01); *H04L 27/0012* (2013.01)

(58) Field of Classification Search
CPC ...... G11B 5/12; H03H 21/00; H03H 21/0067; H03F 1/32; H03F 1/3252; H03F 1/3241; H03F 1/3229; H03F 1/3247; H03F 1/347; H04L 25/02; H04L 25/14; H04L 27/265
USPC .......... 375/340, 232; 360/31, 53, 66, 67, 46, 360/65; 330/149, 151, 263, 267; 455/126, 127.5; 327/100
See application file for complete search history.

(56) References Cited

U.S. PATENT DOCUMENTS

| | | | |
|---|---|---|---|
| 7,012,772 B1 | 3/2006 | Vis | |
| 7,123,659 B2 | 10/2006 | Orihashi et al. | |
| 7,782,235 B1 | 8/2010 | Velazquez | |
| 7,940,198 B1 | 5/2011 | Velazquez | |
| 8,164,496 B2* | 4/2012 | Velazquez | H03F 1/3247 324/603 |
| 8,582,694 B2* | 11/2013 | Velazquez | H04B 1/001 330/151 |
| 9,160,310 B2* | 10/2015 | Velazquez | H04L 27/265 |
| 2002/0030083 A1* | 3/2002 | Engelhard | B23K 20/123 228/112.1 |
| 2002/0031083 A1* | 3/2002 | Jin | G06F 17/142 370/210 |
| 2005/0168360 A1* | 8/2005 | Chen | H03H 17/0621 341/61 |
| 2010/0183106 A1* | 7/2010 | Beidas | H04L 25/03038 375/350 |

\* cited by examiner

COMPENSATOR FOR REMOVING NONLINEAR DISTORTION

CROSS-REFERENCE TO RELATED APPLICATIONS

The present application is a continuation-in-part of and claims priority to co-pending U.S. patent application Ser. No. 13/915,484, filed Jun. 11, 2013, and entitled "Linearity Compensator for Removing Nonlinear Distortion," which is a continuation-in-part of U.S. patent application Ser. No. 13/455,071, filed Apr. 24, 2012, and entitled "Adaptive Digital Receiver" (now U.S. Pat. No. 8,582,694); which is a continuation-in-part of U.S. patent application Ser. No. 12/908,783, filed Oct. 20, 2010, and entitled "Mismatch Compensators and Methods for Mismatch Compensation" (now U.S. Pat. No. 8,164,496); which is a continuation of U.S. patent application Ser. No. 12/817,075, filed Jun. 16, 2010, and entitled "Amplifier Linearizer" (now U.S. Pat. No. 7,940,198); which is a continuation-in-part of U.S. patent application Ser. No. 12/112,380, filed Apr. 30, 2008, and entitled "Adaptive Mismatch Compensators and Methods for Mismatch Compensation" (now U.S. Pat. No. 7,782,235), the disclosures of which are all herein incorporated by reference in their entireties. The '484 application also claims priority to U.S. Provisional Patent Application No. 61/658,116, filed on Jun. 11, 2012, and entitled "Linearity Compensator," the disclosure of which is herein incorporated by reference in its entirety.

BACKGROUND OF THE INVENTION

1. Field of Invention

The present invention relates to electronics and more specifically, to techniques for improving the linear performance of electrical components such as analog-to-digital converters and power amplifiers in radio frequency (RF) transceiver systems.

2. Description of Related Art

An electronic or power amplifier is a device for increasing the power of an input signal. Power amplifiers in most electronic systems are required to be "linear," in that they must accurately reproduce the signal present at their input to achieve efficiency and spectral purity. An amplifier that compresses its input or has a non-linear input/output relationship causes the output signal to splatter onto adjacent frequencies. This causes interference on other frequency channels. Power amplifiers tend to become more non-linear as their power increases towards their maximum rated output.

Power amplifier linearity and efficiency are crucial issues in the design of electronic systems. The power amplifier is one of the most import parts of and usually the largest single contributor to the power consumption of an RF system. Thus, it is desirable to maximize the efficiency of a power amplifier. However, the more efficient power amplifier configuration is used the more nonlinear it usually becomes. Linearity errors in power amplifiers cause harmonic distortion and intermodulation distortion, which can limit the performance of state-of-the-art electronic systems such as, but not limited to radar systems, digital transceivers for wireless 3G and 4G communications, laboratory test equipment, medical imaging, and audio and video compression. Reducing errors in digital-to-analog converters, analog-to-digital converters, sample-and-hold circuitry, and buffer and power amplifiers can significantly improve the performance of the critical conversion process.

An analog-to-digital converter (ADC) is a device for converting continuous radio frequency signals into discrete-time sampled, quantized data for subsequent digital processing. Like power amplifiers, analog-to-digital converters in most electronic systems are required to be "linear," in that they must accurately reproduce the signal present at their input to provide a high-resolution digitized version at its output. An analog-to-digital converter with a non-linear transfer function will introduce distortion components, such as harmonic or intermodulation distortion, that limit the effective resolution and dynamic range of the analog-to-digital conversion.

Several common linearization methods exist for improving the linearity of devices such as power amplifiers and analog-to-digital converters, all of which suffer from drawbacks. All conventional linearization methods are limited in their maximum correctable range, which is the region of power output level near the onset of saturation. One method, known as a feedforward technique, is frequently employed and improves linearity, but results in poor power amplifier efficiency.

Pre-distortion is another technique used to improve the linearity of amplifiers. Digital pre-distortion is used to linearize the nonlinear response of a power amplifier over its intended power range. A pre-distortion circuit inversely models an amplifier's gain and phase characteristics and, when combined with the amplifier, produces an overall system that is more linear and reduces the amplifier's distortion. In essence, "inverse distortion" is introduced into the input of the amplifier, thereby cancelling to some degree any non-linearity the amplifier might have. However, the effectiveness of any pre-distortion technique is directly dependent on the accuracy of the pre-distortion transfer function, i.e., the model of the amplifier's gain and phase distortion characteristics. Traditional pre-distortion techniques implement a second-order or third-order polynomial as the transfer function, which improves the linearity of a power amplifier. However, for advanced RF systems with very high instantaneous bandwidths, transfer functions based on second-order or third-order polynomials are not accurate enough to prevent all non-linear distortion. In fact, many RF devices produce irregular nonlinearities that are difficult to model with standard, integer-power polynomial functions. Moreover, traditional pre-distortion techniques typically employ only one transfer function for a power amplifier, which may be suitable for a particular set of operating conditions. However, when operating conditions vary, e.g., temperature, time, or frequency, the transfer function may no longer be suitable to adequately remove non-linear distortion. Accordingly, there is a need for an improved linearization technique that implements higher-order transfer functions and accounts for varying operating conditions.

Digital post-processing is another technique used to improve the linearity of analog-to-digital converters. Digital post-processing is used to linearize the nonlinear response. Digital post-processing inversely models an analog-to-digital converter's nonlinear distortion transfer function such that the deleterious nonlinear distortion components can be subtracted from the output of the analog-to-digital converter to produce an overall system that is more linear and reduces the nonlinear distortion. In essence, "inverse distortion" is introduced into the output of the analog-to-digital converter, thereby cancelling to some degree any non-linearity the analog-to-digital converter might have. However, the effectiveness of any digital post-processing technique is directly dependent on the accuracy of the nonlinear distortion transfer function, i.e., the model of the analog-to-digital converter's nonlinear distortion characteristics. Traditional digital post-processing techniques implement a second-order or third-order polynomial as the transfer function, which improves the linearity of an analog-to-digital converter. However, for advanced RF systems with very high instantaneous bandwidths, transfer functions based on second-order or third-order polynomials are not accurate enough to prevent all non-linear distortion. Traditional higher-order or more complex models, such as Volterra-based compensation techniques, require a prohibitive amount of signal processing resources (such as multiply-accumulate functions which increases the physical size, weight, power, and cost of the hardware implementation of the digital post-processing). Accordingly, there is a need for an improved linearization technique that implements more complex transfer functions to provide the necessary linearization performance with a reasonable amount of signal processing resources.

SUMMARY OF THE INVENTION

The present invention overcomes these and other deficiencies of the prior art by providing a linearizer comprising a distortion compensator and one or more factored Volterra compensators, which may include a second-order factored Volterra compensator, a third-order factored Volterra compensator, and additional higher-order factored Volterra compensators. Inclusion of factored Volterra distortion compensators improves linearization processing performance while significantly reducing the computational complexity compared to a traditional Volterra-based compensator.

In an embodiment of the invention, a multi-rate Volterra compensator is provided for removing nonlinear distortion introduced by an electronic system, the multi-rate Volterra compensator comprising: a number, k, of processing arms, wherein k is equal to a maximum order of the multi-rate Volterra compensator and is greater than one; for each kth order processing arm, an upsampler for increasing the sampling rate of the multi-rate Volterra compensator's input by a factor of $M_k$, wherein the increased sample rate is commensurate with a bandwidth of the nonlinear distortion; a first bandpass filter coupled to an output of the upsampler, and an upsampled Volterra filter coupled to an output of the first bandpass filter. Each kth order processing arm can further comprise a second bandpass filter coupled to an output of the upsampled Volterra filter, and a downsampler for decreasing the increased sample rate to a sample rate of the multi-rate Volterra compensator's input. For each kth order processing arm, the downsampler and first bandpass filter can be implemented as a first parallel polyphase bandpass filter, and the upsampled Volterra filter is implemented as a parallel downsampled Volterra filter. For each kth order processing arm, the second bandpass filter and upsampler can be implemented as a second parallel polyphase bandpass filter. For each kth order processing arm, the first parallel polyphase bandpass filter, the parallel downsampled Volterra filter, and the second parallel polyphase bandpass filter can be implemented as an equivalent Volterra filter, wherein the equivalent Volterra filter is a multidimensional convolution of a tensor outer product of the first parallel polyphase bandpass filter, the parallel downsampled Volterra filter, and a multidimensional diagonal matrix containing coefficients of the second parallel polyphase bandpass filter. For each kth order processing arm, the upsampler, first bandpass filter, upsampled Volterra filter, second bandpass filter, and downsampler can be implemented as a multidimensional bandpass filter convolved with the downsampled Volterra filter.

In another embodiment of the invention, an oversampled Volterra compensator is provided for removing nonlinear distortion introduced by an electronic system, the oversampled Volterra compensator comprising: a number, k, of processing arms, wherein k is equal to a maximum order of the multi-rate Volterra compensator and is greater than one; for each kth order processing arm, an upsampled Volterra filter operating on a bandlimited subband that is a portion of a full Nyquist bandwidth of the electronic system. Each kth order processing arm can further comprise: a bandpass filter coupled to the output of the upsampled Volterra filter, and a downsampler coupled to the output of the bandpass filter. Each kth order processing arm can further comprise an analog bandpass filter coupled to the output of the upsampled Volterra filter.

In yet another embodiment of the invention, a Volterra compensator is provided for removing nonlinear distortion introduced by an electronic system, the Volterra compensator comprising: a Volterra kernel of order N, wherein N is equal to or greater than two, wherein the Volterra kernel is implemented in a processor comprising: a plurality of exponentiators operating on delayed inputs, and a plurality of parallel FIR filters. The plurality of exponentiators can be second-order exponentiators, third-order exponentiators, and/or fourth or higher-order exponentiators. Only a subset of the plurality of parallel FIR filters with energy above a prescribed threshold can be implemented. The plurality of parallel FIR filters can be implemented in a polyphase configuration.

In yet another embodiment of the invention, a method of determining a pre-distorted signal for an electronic device is provided, the method comprising the steps of: (i) transmitting a transmit signal to the electronic device, wherein the electronic device processes the transmit signal into an output signal; (ii) receiving the output signal from the electronic device; (iii) subtracting the output signal from a reference signal to form an error signal; (iv) adding the error signal to the reference signal to form a pre-distorted signal; repeating steps (i), (ii), (iii), and (iv) with the pre-distorted signal as the transmit signal until the error signal falls below a predetermined threshold; and storing the final pre-distorted signal. The reference signal can comprise multiple desired signals. The step of (i) transmitting a transmit signal to the electronic device comprises: compensating for amplitude and phase distortion caused by a digital-to-analog converter and transmit electronics to form a compensated transmit signal; converting, via the digital-to-analog converter, the compensated transmit signal from a digital signal to an analog signal; and transmitting, via the transmit electronics, the analog signal to the electronic device. The step of (ii) receiving the output signal from the electronic device comprises: receiving, via receive electronics, the output signal; converting, via an analog-to-digital converter, the output signal from an analog signal to a digital signal; and compensating for amplitude and phase distortion caused by the receive electronics and the analog-to-digital converter. The method can further comprise the step of limiting, via a bandpass filter, the bandwidth of the error signal.

In yet another embodiment of the invention, an electronic apparatus comprises: a source for generating a reference signal; a summer, wherein the summer combines the reference signal with an error signal to form a pre-distorted signal; transmit electronics for processing the pre-distorted signal; a digital-to-analog converter to convert the pre-distorted signal into an analog signal, a radio frequency device coupled to an output of the digital-to-analog converter, wherein the radio frequency device processes the analog signal into an output signal, an analog-to-digital converter to convert the output signal into a digital received signal; receive electronics for processing the digital received signal; and a subtractor, wherein the subtractor subtracts the received signal from the reference signal to form the error signal. The electronic apparatus can further comprise a transmit equalization filter to compensate for amplitude and phase distortion caused by the transmit electronics and digital-to-analog converter. The electronic apparatus can further comprise a receive equalization filter to compensate for amplitude and phase distortion caused by the receive electronics and analog-to-digital converter. The electronic apparatus can further comprise a bandpass filter to limit the bandwidth of the error signal.

The present invention provides numerous advantages such as improving and maintaining extremely high performance of power amplifiers and analog-to-digital converters over a wider range of signal and environmental conditions, with reasonable amount of signal processing resources and adaptively tracking and correcting parameters which may drift with time, temperature, frequency, amplitude, etc. The present invention simplifies or eliminates outboard calibration, significantly improves power amplifier and analog-to-digital converter performance, provides built-in test capability (i.e., system failures can be detected and analyzed), and increases reliability. The adaptive processing algorithms of the present invention efficiently share processing resources already present in adaptive systems (e.g., adaptive digital beamforming), and reduce the performance requirements of the analog circuitry because the digital signal processing is used to dramatically improve performance. In sum, the present invention lowers the cost, power, and size of power amplifiers and analog-to-digital converters while improving linearity and efficiency.

The foregoing, and other features and advantages of the invention, will be apparent from the following, more particular description of the preferred embodiments of the invention, the accompanying drawings, and the claims.

BRIEF DESCRIPTION OF THE DRAWINGS

For a more complete understanding of the present invention, the objects and advantages thereof, reference is now made to the ensuing descriptions taken in connection with the accompanying drawings briefly described as follows.

DETAILED DESCRIPTION OF EMBODIMENTS

Figure 1:
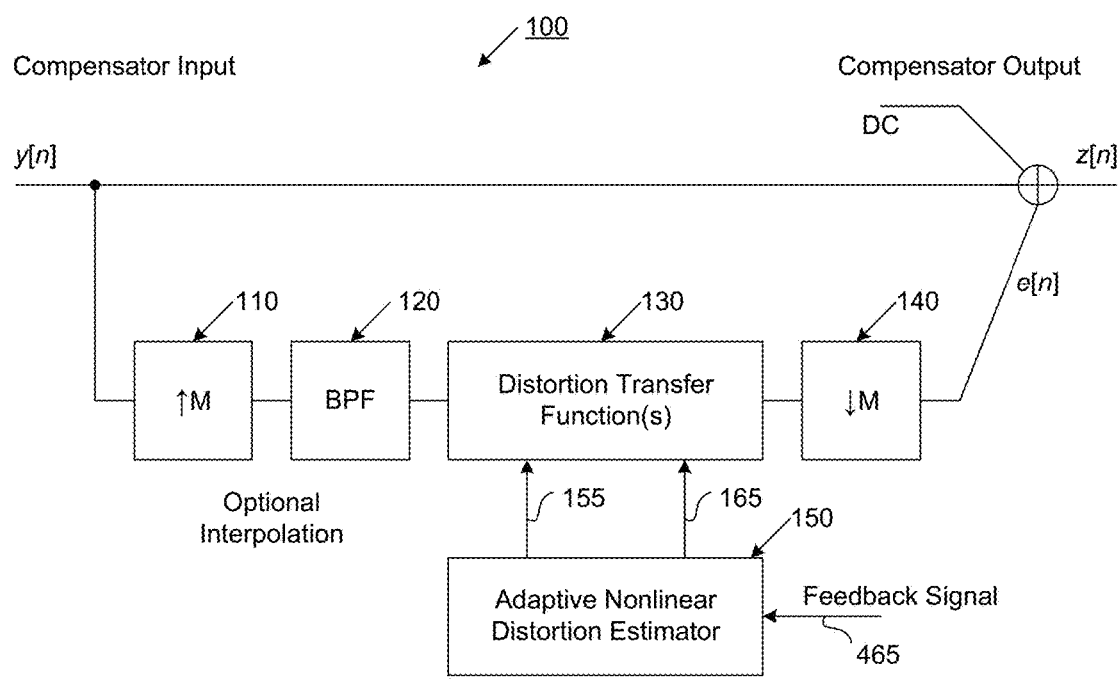
FIG. 1 illustrates a block diagram of a distortion compensator.

Further features and advantages of the invention, as well as the structure and operation of various embodiments of the invention, are described in detail below with reference to the accompanying FIGS. 1-19, wherein like reference numerals refer to like elements. Although the invention is described in the context of power amplifiers and analog-to-digital converters, one of ordinary skill in the art readily appreciates that the linearization techniques described herein are applicable to any type of electronic component where it is desired to accurately and adequately eliminate inherent non-linear errors.

In general, pre-distortion linearization circuitry implements, among other things, (1) a higher-order polynomial model of an amplifier's gain and phase characteristics—higher than a third-order polynomial model; (2) an adaptive calibration technique; and (3) a heuristic calibration technique. The higher-order polynomial model is generated by introducing, for example, a plurality of multi-tone test signals with varying center frequency and spacing into the power amplifier. From the power amplifier's corresponding output, the nonlinearities are modeled by employing a higher-order curve fit to capture the irregularities in the nonlinear transfer function. Different transfer functions can be implemented for different operating conditions. Adaptive calibration is based on a feedback analysis technique, which updates the applicable transfer function by analyzing the error signal between the introduced uncompensated input signal and the compensated output signal in real-time. Heuristic calibration implements different transfer functions based on historical operating conditions and optimal configurations of the power amplifier.

FIG. 1 illustrates a block diagram of a distortion compensator 100. The distortion compensator 100 operates in the digital domain and serves as a general linearity error compensator that accurately nulls distortion by combining a pre-distortion signal e[n] with an input signal y[n] to produce a compensated output signal z[n], such that:

$$y[n]+e[n]=z[n]$$

The distortion compensator 100 is coupled to an RF transmission chain (not shown) and digital signal processing circuitry (not shown) as part of an RF communications system. A typical RF chain comprises a digital-to-analog converter, one or more filters, upconversion circuitry, a high-power amplifier (HPA), and an RF antenna. Although the present disclosure is described in the context of pre-distortion, i.e., pre-processing circuitry, the linearization techniques described herein can be implemented as digital post-processing circuitry to compensate for distortion introduced by an RF receiving chain. A typical RF receiving chain (not shown) comprises an RF antenna, a low-noise amplifier (LNA), downconversion circuitry, one or more filters, and an analog-to-digital converter. The implementation of an RF transmission chain, RF receiving chain, and digital signal processing circuitry in an RF transceiver system is readily apparent to one of ordinary skill in the art.

The distortion compensator 100 comprises an upsampler 110, a band-pass filter 120, a distortion transfer function circuitry 130, a downsampler 140, and an adaptive nonlinear distortion estimator 150. The inclusion of the upsampler 110, the band-pass filter 120, and the downsampler 140 is optionally employed in order to perform interpolation, the implementation of which is apparent to one of ordinary skill in the art. Interpolation increases the bandwidth of the distortion compensator 100 by estimating the compensator input signal, y[n], at intermediate points. This allows the compensator 100 to properly resolve harmonic and intermodulation distortion components that exceed the Nyquist bandwidth of the sampled system. In operation, the upsampler 110 increases the sampling rate of the compensator input signal, y[n], by a factor of M. The band-pass filter 120 preserves the fundamental content of the compensator input signal, y[n], by removing content above and/or below the original Nyquist limit of the signal. The downsampler 140 decreases the sampling rate to the original sampling rate of the compensator input, y[n]. The downsampler 140 is coupled to an adder as shown. Optionally, a linear filter may be included on the fundamental path which operates on the compensator input signal, y[n], and the output of which couples to the adder instead of directly coupling the compensator input signal, y[n], to the adder as shown. This optional linear filter can be configured to compensate for the linear, frequency-dependent gain and phase response, which when compensated, also improves the frequency-dependent performance of the nonlinear distortion.

Figure 2:
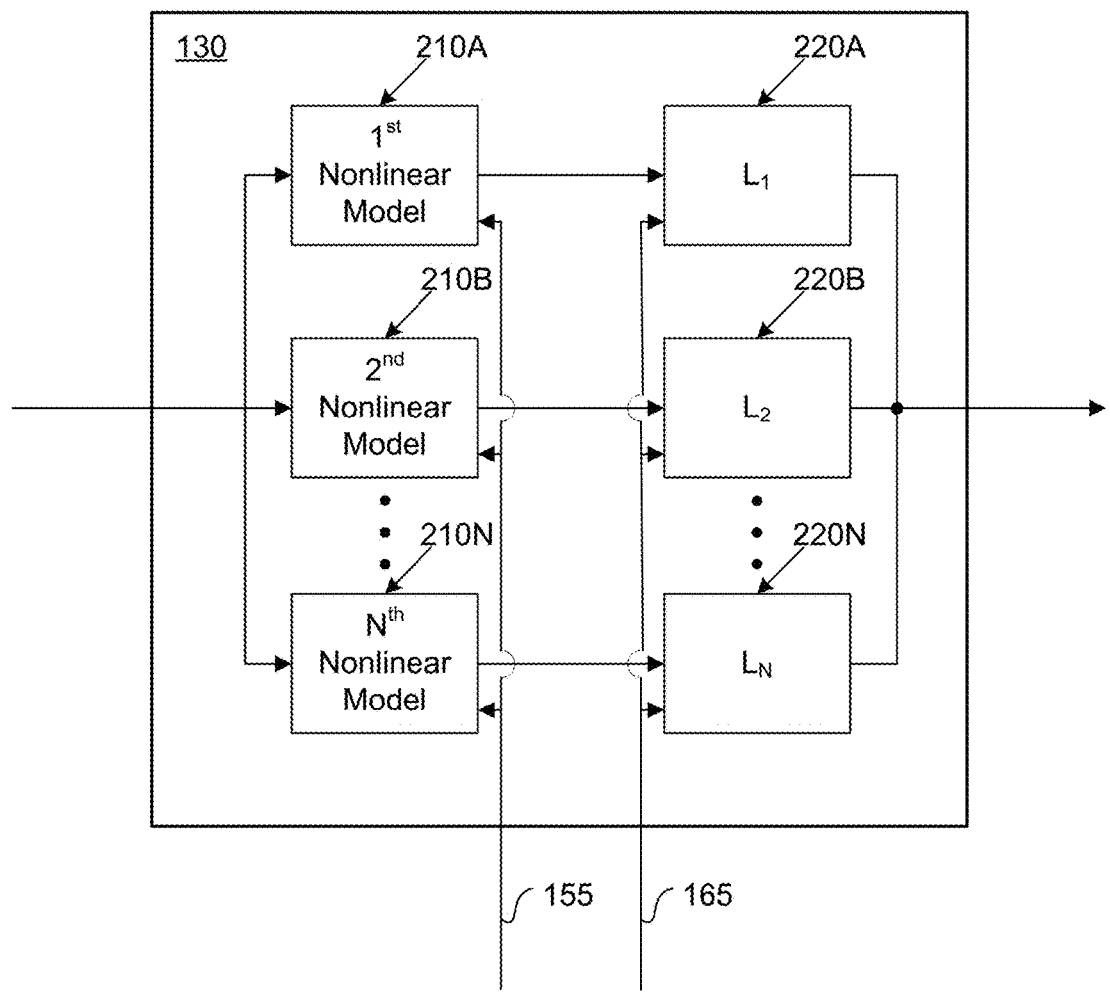
FIG. 2 illustrates a block diagram of the distortion transfer function circuitry of FIG. 1.

FIG. 2 illustrates a block diagram of the distortion transfer function circuitry 130. The distortion transfer function circuitry 130 is coupled to the band-pass filter 120 and the downsampler 140, and receives input signals 155 and 165 from the adaptive nonlinear distortion estimator 150. The distortion transfer function circuitry 130 can employ any number "N" of nonlinear distortion models. Referring to FIG. 2, the distortion function circuitry 130 comprises N number of nonlinear distortion models 210A-N and an equal number of gain/phase shift filters 220A-N. Each nonlinear distortion model 210I is coupled to a corresponding gain/phase shift filter 220I. Each gain/phase shift filter 220 comprises one or more digital filters (e.g., finite impulse response (FIR) filters of length 16 taps). In an embodiment of the invention, the digital filters are fit to the measured amplitude and phase variation across the desired frequency band using standard least mean squares (LMS) or minimization of maximum error (MINIMAX) filter design algorithms. The digital filters are key components that allow precise cancellation of the nonlinear distortion components as they vary in gain and phase over frequency.

Two nonlinear distortion models 210A and 210B can be implemented. The nonlinear model 210A compensates for asymmetric, or odd order, distortion components. The nonlinear model 210B compensates for symmetric, or even order, distortion components. The gain/phase shift filter 220A or 220B is coupled to the respective nonlinear model 210A or 210B to dynamically adjust the distortion components such that they are canceled in the compensated output z[n] over a wide frequency band as described below.

Each nonlinear distortion model 210 is produced by curve fitting a measured distortion transfer function (i.e., distortion level as a function of input level). For example, curve fitting may be implemented using a MINIMAX technique, the implementation of which is apparent to one of ordinary skill in the art. Other curve fitting techniques can be employed such as, but not limited to an LMS methodology or a nonlinear statistical regression analysis, the implementation of all of which are apparent to one of ordinary skill in the art. In at least one embodiment of the invention, the nonlinear distortion models 210A and 210B comprise a $13^{th}$ order polynomial as the asymmetric transfer function and a $12^{th}$ order polynomial as the symmetric transfer function. However, higher order polynomials can be implemented if adequate processing resources are available. Nonetheless, from experimental results, $7^{th}$ order and $8^{th}$ order polynomials are usually adequate to compensate for asymmetric and symmetric non-linear distortion when practicing the present invention. In another embodiment of the invention, a single nonlinear distortion model 210 is employed by implementing an even and odd order polynomial model. Alternatively, a single polynomial model is implemented where one or more of the exponents are not integers.

The asymmetric and symmetric models 210A and 210B are fitted to an error distortion profile resulting from a plurality of injected test signals. For example, a set of 10 to 15 multi-tone test signals with varying center frequency and spacing is used to measure the resulting harmonic and intermodulation distortion components likely during manufacturing of the RF system. For each test signal, a buffer of approximately 128K samples is captured and the fast Fourier transformation (FFT) spectrum is analyzed, the implementation of which is apparent to one of ordinary skill in the art, to measure the relative amplitude and phase shift of each of the distortion components. The results are tabulated, and distortion transfer functions are calculated for the selected distortion components. The distortion transfer function is the measured level of the selected distortion components as a function of the input signal level. A higher order polynomial function as described above is fit to the measured distortion transfer functions to form the nonlinear distortion model, which represents the typical distortion behavior of the device.

Figure 3:
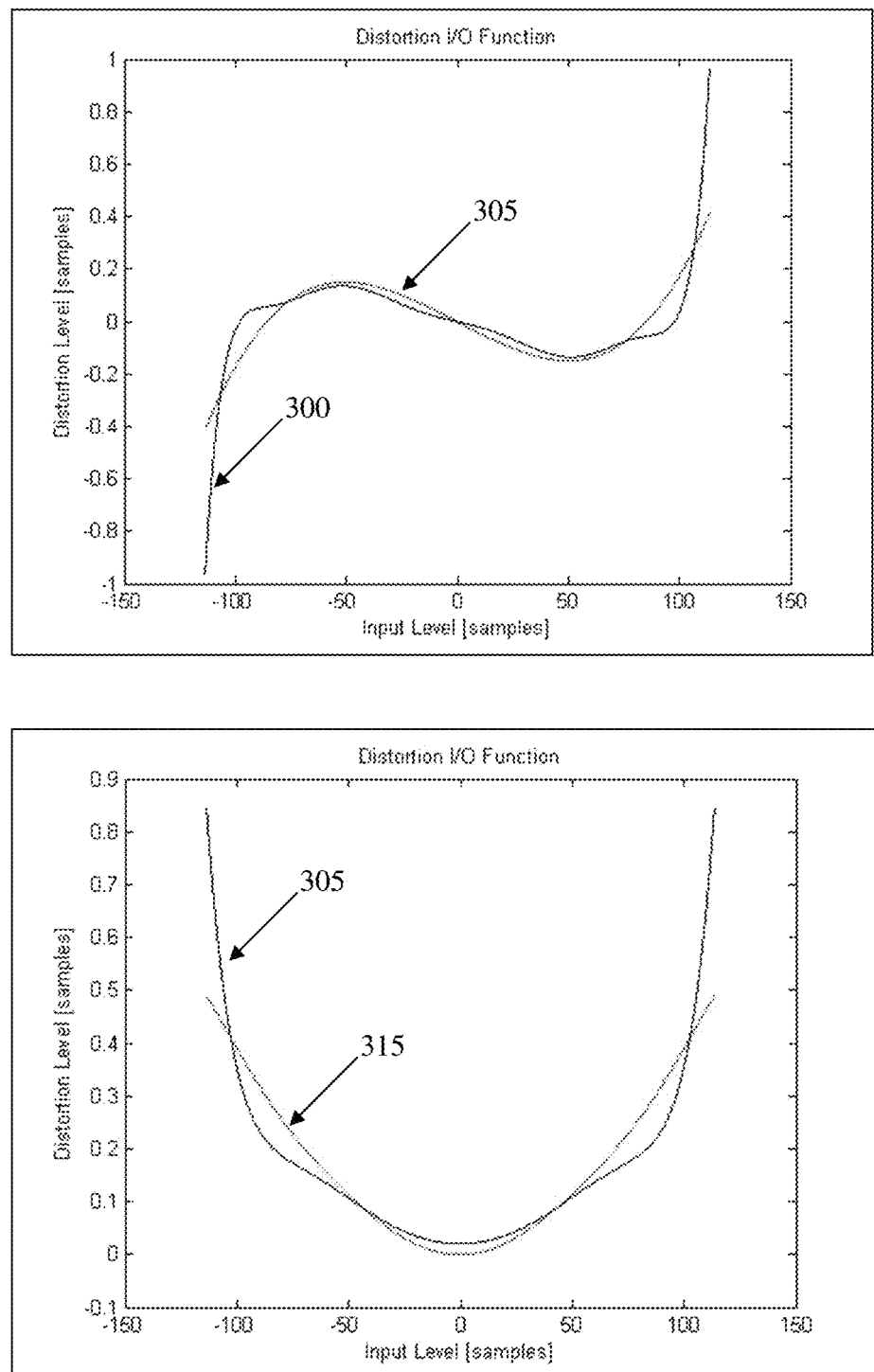
FIG. 3 illustrates exemplary asymmetric and symmetric distortion transfer functions.

FIG. 3 illustrates exemplary asymmetric and symmetric distortion transfer functions 300 and 310. The asymmetric distortion function 300 accounts for odd order distortion components (e.g., up to the seventh-order) that are not possible to model accurately with a standard third-order polynomial function 305. The symmetric distortion transfer function 310 accounts for even order distortion components (e.g., up to the eighth-order) that are not possible to model accurately with a standard second-order polynomial function 315.

Referring back to FIG. 2, in an alternate embodiment of the invention, the nonlinear models 210A-N are configured for non-harmonically related distortion components, for example, mixing image products, clock leakage, adjacent channel leakage, and/or other interference or nonlinear distortion. To accurately model mixing image products, the nonlinear model 210A-N may include a mixer, which multiplies a signal with a sinusoidal local oscillator signal to shift its frequency content to another frequency. It may optionally include a bandpass filter to select one or more mixing image products.

Figure 4:
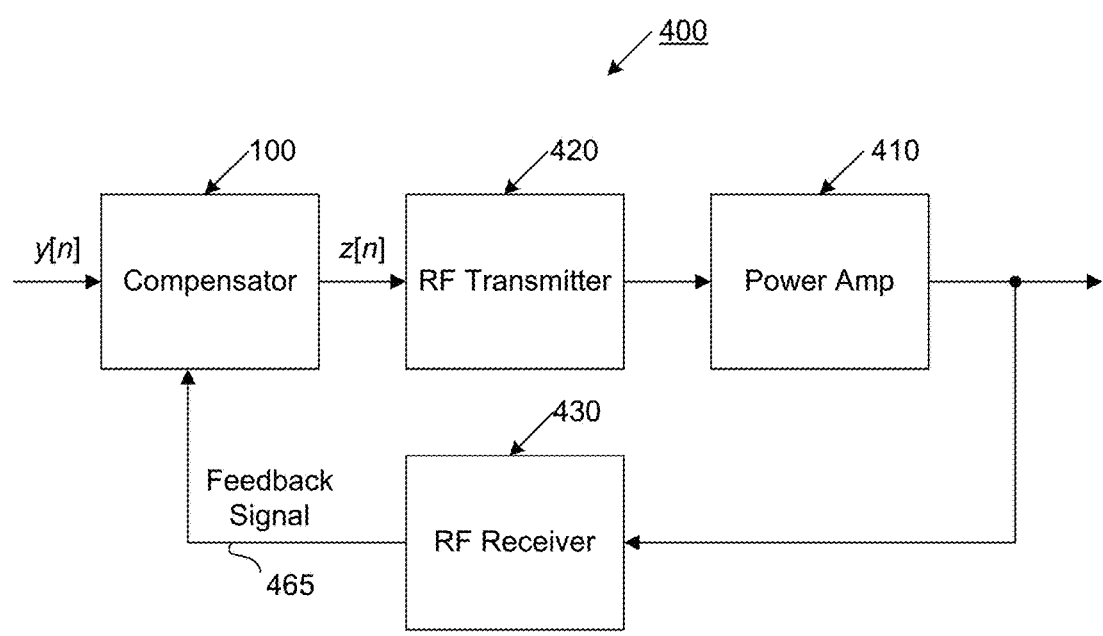
FIG. 4 illustrates an adaptive linearized power amplifier system.

FIG. 4 illustrates an adaptive linearized power amplifier system 400. The system 400 comprises the compensator 100, an RF transmitter 420, a power amplifier 410, and an RF receiver 430. The RF transmitter 420 comprises a digital-to-analog converter and may optionally include RF upconversion electronics to convert a baseband signal to a higher RF. The power amplifier 410 amplifies the RF signal and introduces the undesired nonlinear distortion. The power amplifier 410 output is tapped and coupled to the RF receiver 430. The RF receiver 430 comprises an analog-to-digital converter and may optionally include RF downconversion electronics to convert the power amplifier output from RF to baseband. The feedback signal 465 is a digitized representation of the tapped power amplifier output, which is used by the compensator 100 to update its behavior, through the adaptive nonlinear distortion estimator 150, for optimal performance.

Figure 5:
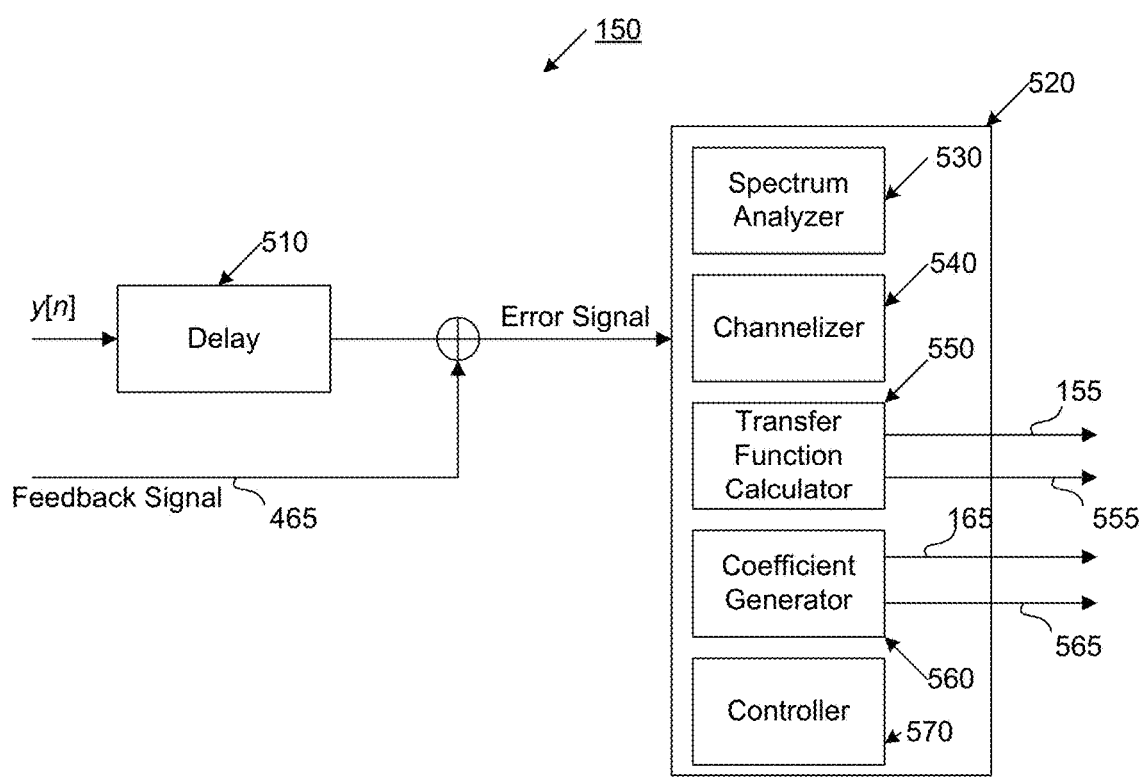
FIG. 5 illustrates the adaptive nonlinear distortion estimator of FIG. 1.

FIG. 5 illustrates the adaptive nonlinear distortion estimator 150. The estimator 150 comprises a delay 510 and a parameter updater 520. The delay 510 delays the system input, y[n], so that it properly aligns with the feedback signal 465, which is a digitized representation of the power amplifier 410 output and is subject to delays incurred in the processing and circuitry of the system 400. The delayed input signal is combined with the feedback signal 465 via an adder to subtract out an error signal between the compensated output signal, z[n], and the uncompensated signal, y[n]. The error signal is a representation of the difference between the input uncompensated signal, y[n], and the amplifier output, which includes the nonlinear distortion components that the compensator 100 corrects.

This error signal is introduced to the parameter updater 520. The parameter updater 520 comprises a spectrum analyzer 530, a channelizer 540, a transfer function calculator 550, a coefficient generator 560, and a controller 570, the implementation of all of which are apparent to one of ordinary skill in the art. Upon processing of the error signal, the transfer function calculator 550 outputs updated transfer function parameters 155, which are used by the nonlinear distortion transfer function circuitry 130 to further refine the nonlinear models 210A-N. The coefficient generator 560 outputs updated filter coefficients 165, which are used by the gain/phase shift filters 220A-N to fine tune the overall pre-distortion. The spectrum analyzer 530 evaluates the spectral content of the error signal, for example, with an FFT operation. The controller 570 uses this spectral content information to determine if the current signal is suitable for estimation of the nonlinear distortion components. For example, if the signal levels are currently too low for accurate estimation, then the controller will wait for a larger signal to appear before continuing with the estimation. The channelizer 540 partitions the error signal into frequency subbands, for example, with a digital filter bank, to analyze the distortion components over different frequencies.

The transfer function calculator 550 stores a table of the current distortion transfer function that maps the delayed input signal to the error signal, for example, in random access memory (RAM). The transfer function calculator 550 may also use a curve-fitting algorithm, the identification and implementation of which are apparent to one of ordinary skill in the art, to fit a polynomial equation to the transfer function. The calculator 550 outputs transfer function parameters 155, which may be this equation or the memory table. The calculator 550 optionally outputs similar transfer function parameters 555, which may be this equation or the memory table, for use in a heuristic compensation process described below. The coefficient generator 560 uses the output of the spectrum analyzer 530 to measure the relative gain and phase shift of the selected nonlinear distortion components. These gain and phase shift measurements are cataloged over frequency for different input signals. Standard digital filter design methods may be used to fit a digital filter to the gain and phase shift measurements to generate the coefficients 165 of the gain/phase shift filters 220A-N. The generator 560 optionally outputs coefficients 565 for use in a heuristic compensation process described below.

In essence, the adaptive nonlinear distortion estimator 150 serves as a blind adaptive calibration routine to significantly simplify or even eliminate system calibration, i.e., the adaptive routine can be used to monitor the system output, z[n], and interactively adjust the nonlinear models 210A-N and the gain/phase shift filters 220A-N to minimize the nonlinear distortion without requiring any external calibration signal sources or by requiring the interruption of the normal operation of the system. The blind adaptive calibration routine does not require the use of a pilot signal to characterize the system, which eliminates the need to generate test signals during operation of the applicable RF communications system. Since the mathematical relationship between the desired output and the nonlinear error signals is known for arbitrary input signals, this relationship can be used to estimate the amplitude and phase of the error signals. The blind adaptive calibration routine (implemented, for example, in a digital signal process) iteratively adjusts the digital filters to subtract (or null) these error signals from the output signal. FFT analysis (or other wavelet time-frequency analysis) can be used to measure how accurately the error signals have been nulled. Accurate nulling of these error signals means the processing is optimized.

Heuristic calibration is also implemented. Heuristic calibration maintains and updates the calibration history over numerous operating conditions, e.g., time, temperature, frequency, etc. For example, distortion transfer functions are generated for various sets of operating conditions and are stored in a look-up table. In the event that operating conditions change, an applicable higher order asymmetric and symmetric transfer function can be loaded into the nonlinear models 210A-N or an applicable set of filter coefficients 165 can be loaded into the gain/phase shift filters 220A-N, or both. This permits the compensator 100 to quickly switch to an optimal configuration, which will be further refined through the blind adaptive calibration technique discussed above.

Figure 6:
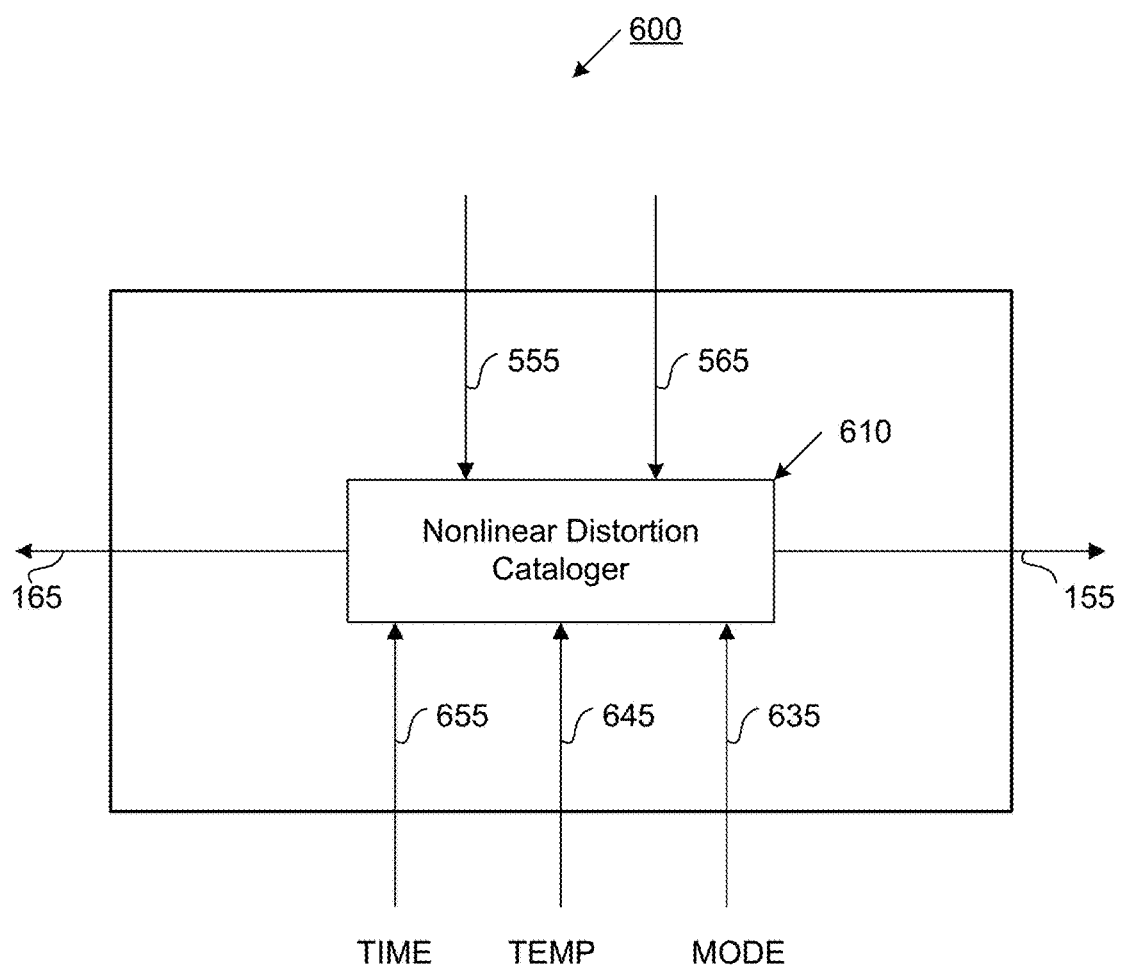
FIG. 6 illustrates a heuristic calibration system.

FIG. 6 illustrates a heuristic calibration system 600. Particularly, the heuristic calibration system 600 comprises a nonlinear distortion cataloger 610, which stores a history of various measurements, including, but not limited to transfer function parameters 555, filter coefficients 565, and other relevant parameters such as mode of operation 635, temperature 645, and time 655. The nonlinear distortion cataloger 610 outputs distortion transfer function parameters 155 and updated filter coefficients 165 that are calculated heuristically based on the current operation conditions, such as time, temperature, and mode of operation. The nonlinear distortion cataloger 610 can record a number of different measurements to allow for accurate interpolation or extrapolation of the transfer function parameters 155 and updated filter coefficients 165, given the RF system's current operating mode, current temperature, other current conditions, and over a range of frequencies. This record of different measurements can be stored in a catalog (not shown). The nonlinear distortion cataloger 610 can extract the most relevant measurements from the catalog in response to the current operating conditions of the system.

For example, the nonlinear distortion cataloger 610 can extract all of the nonlinear distortion level measurements that have been stored in the catalog that are for the current operating mode 635, within 5 degrees Celsius of the current temperature 645, with the last 30 seconds of the current time 655, and over all the frequencies at which measurements have been stored in the mismatch catalog. Repeated measurements at the same frequency can be averaged for a more accurate estimation. Missing measurements for particular frequencies can be interpolated or extrapolated from the extracted measurements. Measurements that vary significantly from previously stored measurements can be discarded since they may indicate a measurement glitch. This process performed by the nonlinear distortion cataloger 610 of extracting the relevant data from the catalog, combining repeated measurements, interpolating or extrapolating missing measurements, and discarding inaccurate measurements is a heuristic process that generates the transfer function parameters 155 and updated filter coefficients 165.

Figure 7:
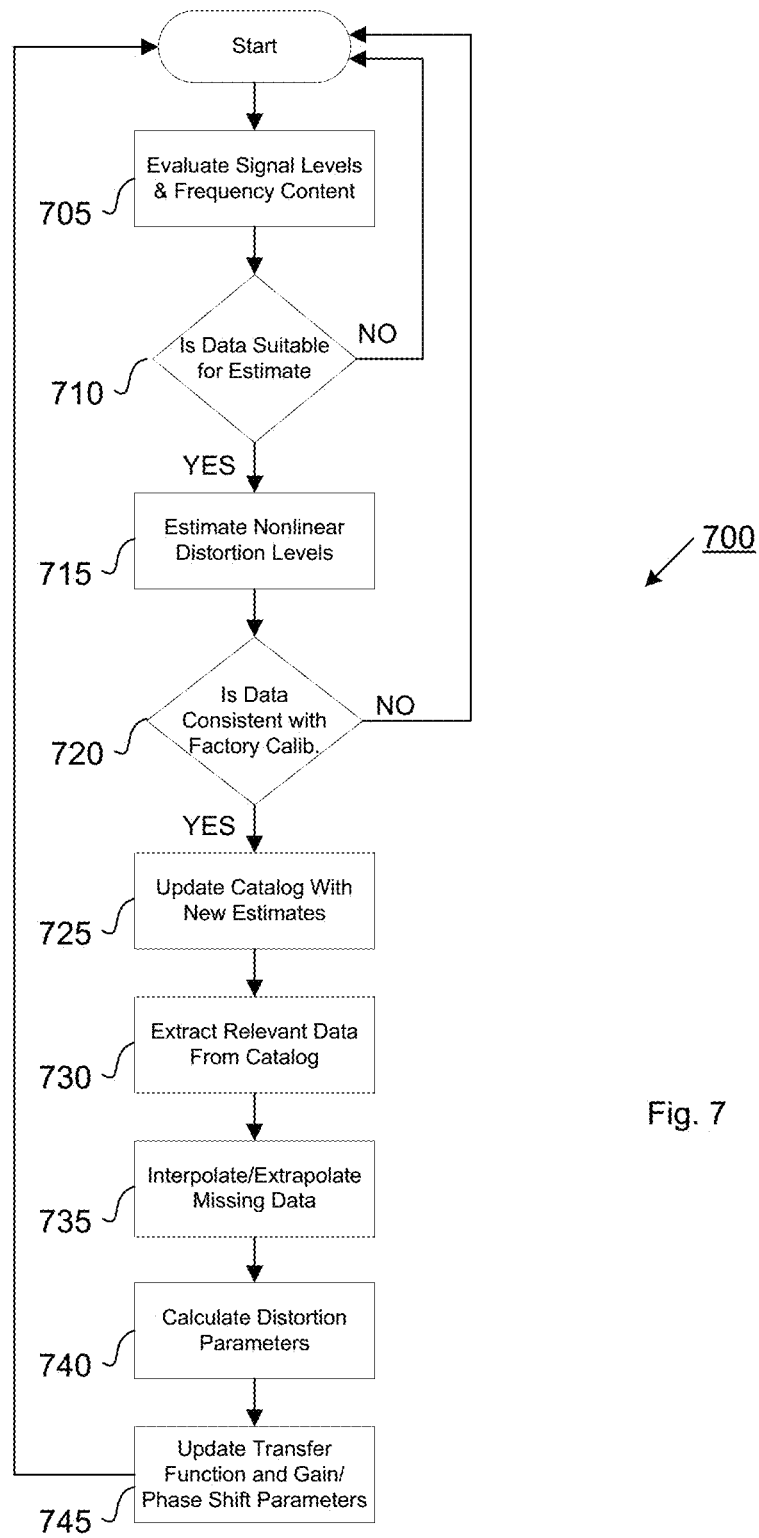
FIG. 7 illustrates a process for heuristically compensating nonlinear distortion.

FIG. 7 illustrates a process 700 for heuristically compensating nonlinear distortion. This process 700 is controlled by the nonlinear distortion cataloger 610 as shown in FIG. 6. The nonlinear distortion cataloger 610 can be implemented as a microprocessor or an embedded processor with a field programmable gate array. Particularly, the process 700 begins by evaluating (step 705) the amplitudes and frequency content of the nonlinear distortion levels and determining (step 710) if that data is suitable for accurate estimation of the nonlinear distortion. The accuracy of the estimation can be degraded, for example, if the signal levels are very low (for example, less than −20 dBFS); therefore, for the most accurate estimation, the process can continually monitor the incoming signal until its amplitude is above a predetermined threshold. The single amplitude and frequency content can be measured, in one embodiment, with a FFT analysis of the input signals. A 512 point FFT can be performed with a microprocessor or embedded processor, and the magnitude of each FFT bin can be measured to determine the signal amplitude at various frequencies.

If the signal amplitude and frequency content is suitable, then the nonlinear distortion levels can be estimated (step 715). Optionally, the current estimations can be compared (step 720) to the factory calibration values stored in the catalog to insure that the current estimations are not significantly different. A significant difference can indicate a component failure, a signal glitch, or other anomaly, whereby a determination can be made that the current estimation is not valid. If the current estimation is determined to be valid, then the new estimates are stored (step 725) in the catalog.

Based on the current operating conditions, such as current operating mode 635, temperature 645, and time 655, the catalog is searched and any relevant measurements are extracted (step 730), such as measurements near the current system temperature or having the same operating ode. If any pertinent measurements are missing from the catalog, they can be interpolated or extrapolated (step 735). For example, the catalog may contain estimates at a few different frequencies, but the values at the remaining frequencies can be interpolated or extrapolated using, in at least one embodiment of the invention, spline data fitting algorithms. Based on the interpolated/extrapolated data, the optimal nonlinear distortion parameters 155 and 165 can be calculated (step 740). The parameters are used to update (step 745) the nonlinear models 210A-N and the gain/phase shift filters 220A-N Referring back to FIG. 5, the controller 570 operates in the background to guide the processing of data with the spectrum analyzer 530, channelizer 540, transfer function calculator 550, coefficient generator 560, and nonlinear distortion cataloger 610. The controller 570 may be implemented with a digital signal processor or an embedded processor, for example, a field programmable gate array. A program instantiated in the controller 570 can implement the process 700 for heuristically compensating nonlinear distortion, as shown in FIG. 7.

The controller 570 may also implement an iterative optimization algorithm that repeatedly analyzes the error signal via the spectrum analyzer 530 to adjust the transfer function calculator 550 and the coefficient generator 560 for optimal performance. Standard iterative optimization algorithms, such as a binary search or Newton's Method may be used. For example, the filter coefficients 165 calculated by the coefficient generator 560 may be iteratively optimized to adjust the amplitude and/or phase shift of the pre-distortion signal such that the selected distortion components are nulled in the output.

In general, the power specification for an amplifier is chosen based on the type of signal to be transmitted (e.g., the peak-to-average signal level), the desired power output, and the desired dynamic range (e.g., third-order intercept point (IP3), 1 dB compression point). Conventional amplifiers are often backed off such that the peak power does not exceed the 1 dB compression point (typically, amplifiers are backed off even a few dB more to insure signals remain in the linear operating region). For example, a typical communications signal may have a peak-to-average ratio of 9 dB, so the amplifier may be backed off by approximately 12 dB below its 1 dB compression point to insure linear amplification. The present invention can be used to increase the 1 dB compression point by 3 to 6 dB, which allows the back-off to be reduced commensurately. This corresponds to reducing the necessary power rating for the amplifier by one-half to one-quarter, which significantly improves the amplifier efficiency (i.e., as the back-off decreases, the efficiency increases). Moreover, the present invention provides a 35 to 40 dB improvement to the spurious free dynamic range (SFDR). Conventional linearization techniques only provide a 10 dB improvement.

Standard, commercially-available field programmable gate array (FPGA) chips are capable of digital signal processing at approximately 400 MHz data rate. For data rates higher than 400 MHz, the processing can be transformed into simultaneous parallel channels, for example, using polyphase filtering structures. For example, 4 GHz data can be demultiplexed into 16 lower data rate (250 MHz each) channels for real-time parallel processing in a standard FPGA (providing an instantaneous bandwidth of 2 GHz).

Linearity compensation techniques are described in commonly-owned U.S. Pat. No. 6,198,416, and calibration techniques are described in U.S. patent application Ser. No. 12/112,380, entitled "Adaptive Mismatch Compensators and Methods for Mismatch Compensation," the disclosures of which are incorporated by reference herein in their entirety.

The following describes additional layers of processing that can be added to the linearization techniques described above.

Figure 8:
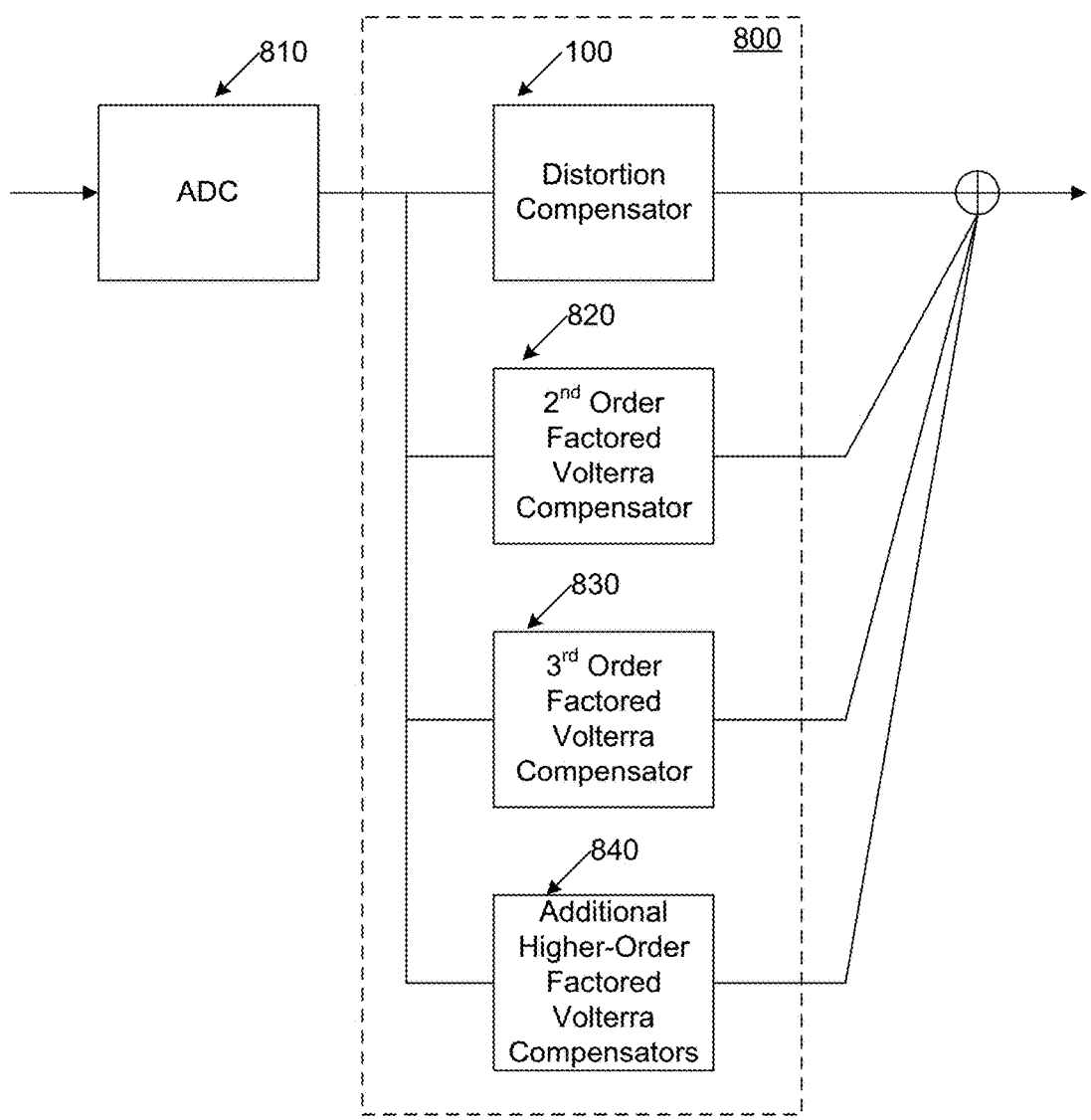
FIG. 8 illustrates a block diagram of a linearity compensator according to an embodiment of the invention.

FIG. 8 illustrates a block diagram of a linearity compensator 800 according to an embodiment of the invention. The linearity compensator 800 operates on an analog-to-digital converter (ADC) 810 and comprises the distortion compensator 100 and one or more factored Volterra compensators, which may include a second-order factored Volterra compensator 820, a third-order factored Volterra compensator 830, and additional higher-order factored Volterra compensators 840. Output of the ADC 810 is coupled to the inputs of the distortion compensator 100, the second-order factored Volterra compensator 820, the third-order factored Volterra compensator 830, and the additional higher-order factored Volterra compensators 840. The outputs of the distortion compensator 100, the second-order factored Volterra compensator 820, the third-order factored Volterra compensator 830, and the additional higher-order factored Volterra compensators 840 are coupled to an adder as shown. Volterra (or Volterra series) is a model for non-linear behavior where the output of the nonlinear system depends on the input to the system at theoretically all other times, thereby modeling intermodulation distortion of the system. Inclusion of the factored Volterra distortion compensators 820-840 improves linearization processing performance while significantly reducing the computational complexity compared to a traditional Volterra-based compensator without using the distortion compensator 100. In an embodiment of the invention, the factored Volterra distortion compensators 820-840 can be bypassed where only the distortion compensator 100 is implemented as described in FIGS. 1-7.

Figure 9:
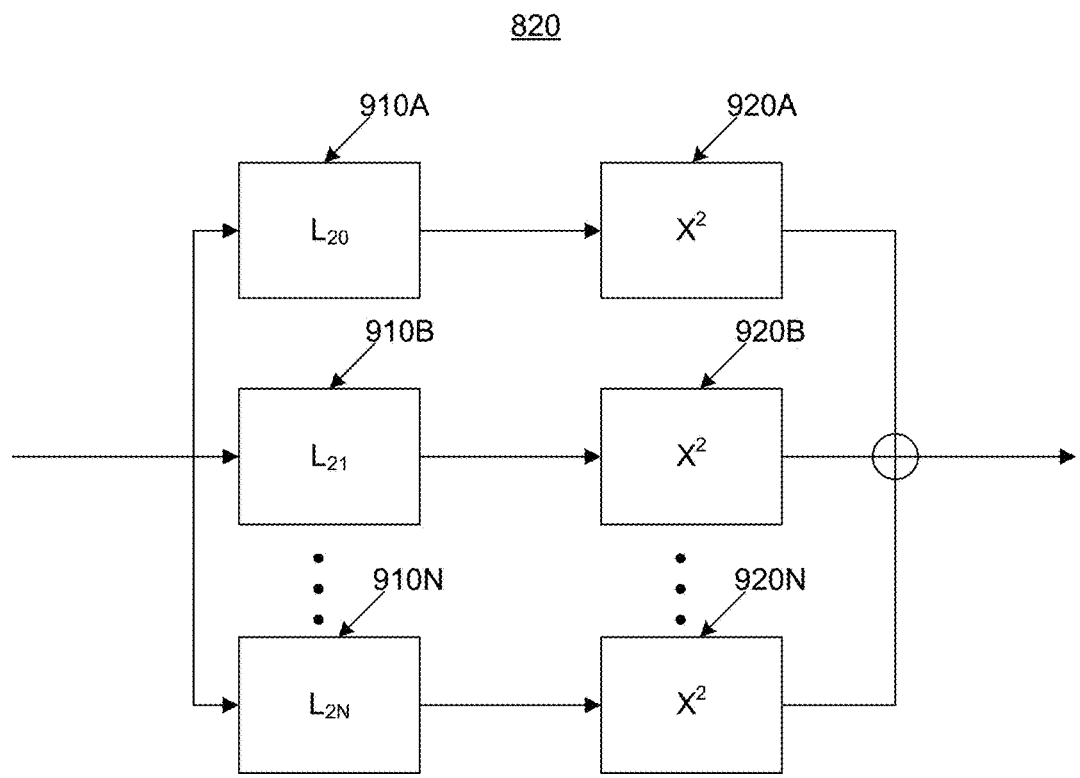
FIG. 9 illustrates the structure of the second-order factored Volterra compensator according to an embodiment of the invention.

FIG. 9 illustrates the structure of the second-order factored Volterra compensator 820 according to an embodiment of the invention. This second-order factored Volterra compensator 820 comprises a number, N, of linear filters 910A-N, each of which has a corresponding squaring function 920A-N. The outputs of the squaring functions 920A-N are added together to produce the compensation signal output of the second-order factored Volterra compensator 820. In an embodiment of the invention, filter 910A is a 4-tap FIR filter. Accordingly, N is equal to 4, i.e., there are four filters 910A-D. The N linear filters 910A-N correspond to the dominant factors of the Volterra series; the process of measuring and factoring the Volterra series is described below.

Figure 10:
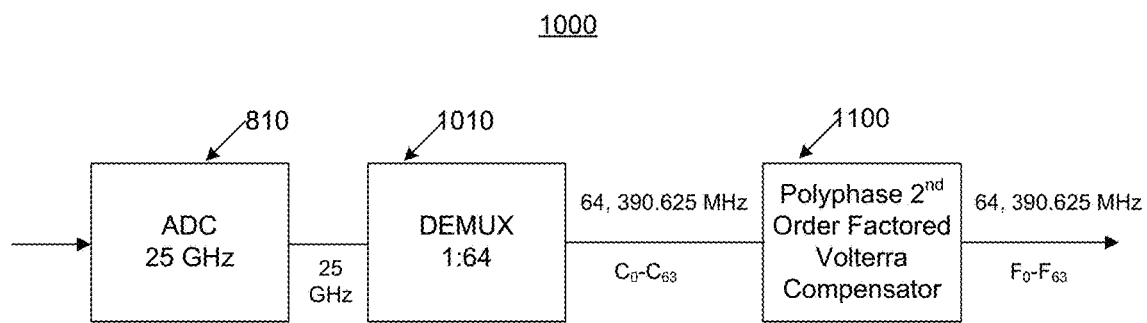
FIG. 10 illustrates the second-order factored Volterra compensator operating in a parallel polyphase configuration according to an exemplary embodiment of the invention.

FIG. 10 illustrates the second-order factored Volterra compensator operating in a parallel polyphase configuration 1000 according to an exemplary embodiment of the invention. Here, the ADC 810 is operating at 25 GHz. A 1:64 demultiplexer 1010 ("DEMUX") is coupled to the output of the ADC 810 and a polyphase second-order factored Volterra compensator 1100. Accordingly, the polyphase second-order factored Volterra compensator 1100 operates on 64 demultiplexed ADC output signals, referred in the figure as $C_0$-$C_{63}$ at a relatively low data rate of 390.625 MHz. The demultiplexed compensation signal outputs from the polyphase second-order factored Volterra compensator 1100 are referred in the figure as $F_0$-$F_{63}$. Without this parallelization of the processing into numerous lower data rate paths, the extremely fast data rate would be beyond the capabilities of realizable hardware, such as digital signal processors (DSP), field programmable gate arrays (FPGA), or application specific integrated circuits (ASIC). Such parallelization may be implemented, for example, as polyphase finite impulse response (FIR) filters, the implementation of which is readily apparent to one of ordinary skill in the art. Likewise, a polyphase third-order factored Volterra compensator (not shown) operates on 64 demultiplexed ADC output signals, referred in the figure as $C_0$-$C_{63}$ at a data rate of 390.625 MHz.

Figure 11:
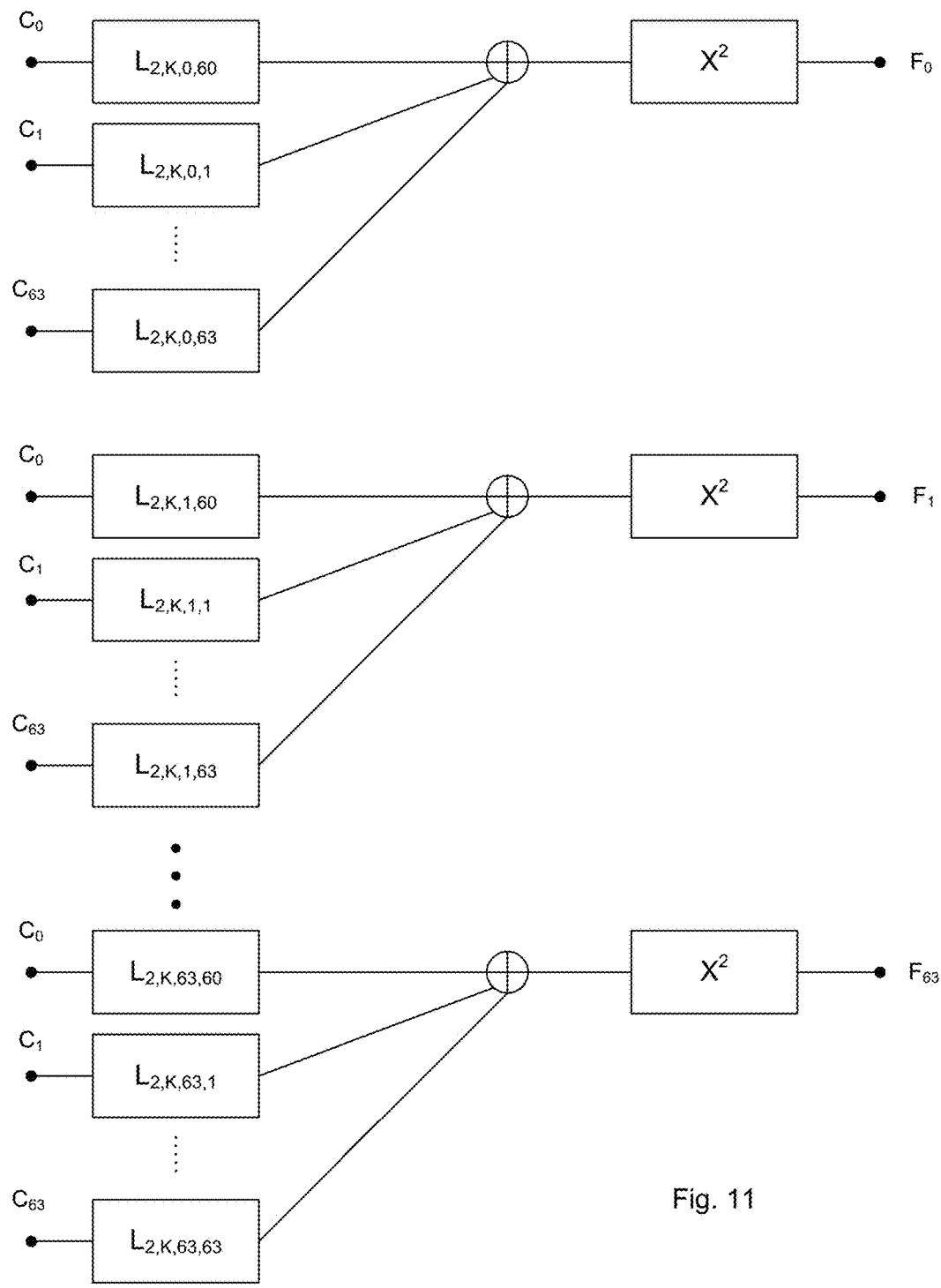
FIG. 11 illustrates filters implemented in a parallel polyphase configuration according to an embodiment of the invention.

FIG. 11 illustrates filters 910A-D implemented in a parallel polyphase configuration 1100 according to an embodiment of the invention. Each filter 910A-D is implemented using 64 parallel polyphase filters, each operating at 1/64 the system data rate. Here, because each filter 910A-D uses 4 taps (or multipliers) and there are 64 parallel polyphase filters, a total of 256 active multipliers are employed in the polyphase version of each filter 910A-D. This is repeated for each of the four filters 910A-D, thus using a total of 1,024 multipliers. The squaring functions 920A-N implemented in the parallel polyphase configuration use a total of 64 multipliers, one for each output $F_0$-$F_{63}$. Therefore, a total of 1,088 multipliers (1,024 plus 64) are needed for the parallel polyphase configuration 1100 of the second-order factored Volterra compensator 820

Figure 12:
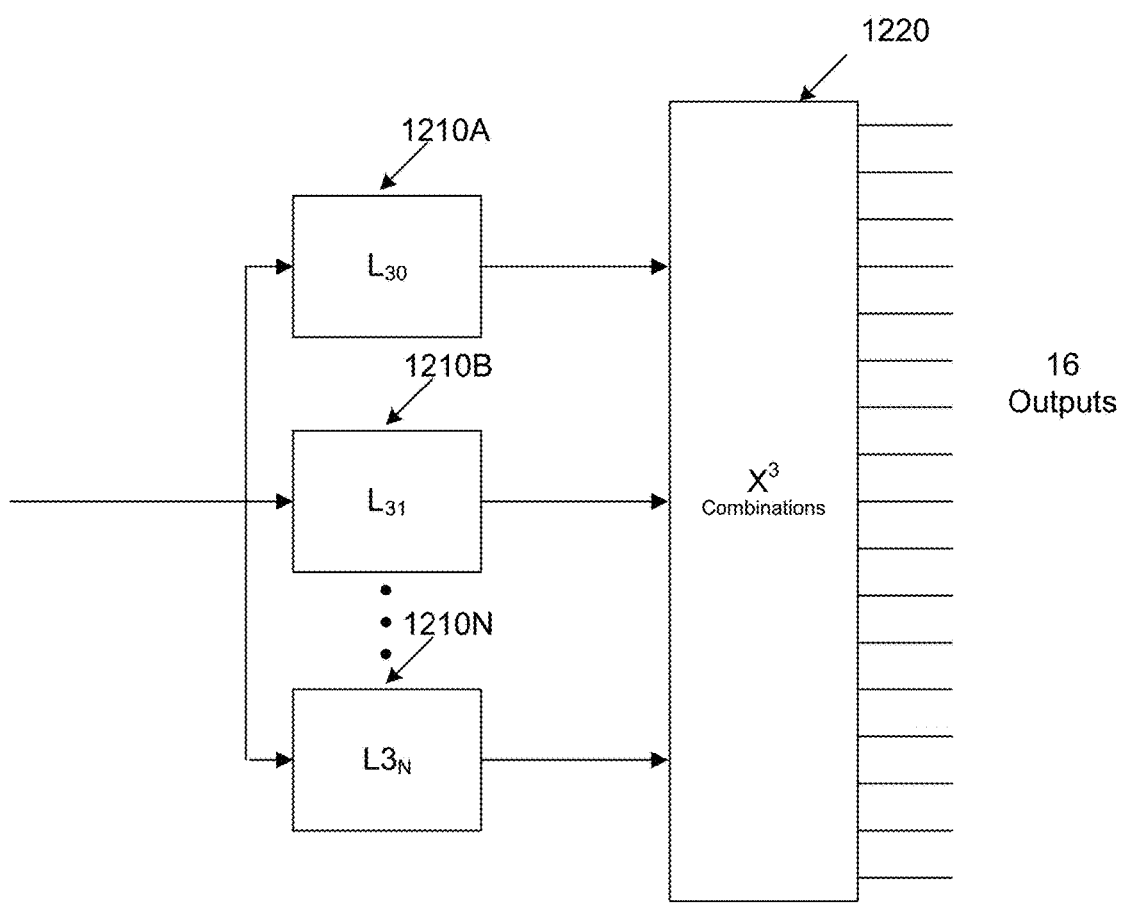
FIG. 12 illustrates the structure of the third-order factored Volterra compensator according to an embodiment of the invention.

FIG. 12 illustrates the structure of the third-order factored Volterra compensator 830, according to an embodiment of the invention. The third-order factored Volterra compensator 830 comprises a number, N, of linear filters 1210A-N, the outputs of which are coupled to a $3^{rd}$ order polynomial function 1220. In an embodiment of the invention, filter 1210A is a 4-tap FIR filter. Accordingly, N is equal to 4, i.e., four filters 1210A-D. The $3^{rd}$ order polynomial function 1220 has 16 outputs which are coupled to an adder (not shown) to produce the compensation signal output of the third-order factored Volterra compensator 830. The filters 1210A-N can be implemented in a similar parallel configuration to 1100 in FIG. 11, where the squaring functions are replaced with $3^{rd}$ order polynomial functions. This structure of the third-order factored Volterra compensator 830 can be extended to higher order factored Volterra compensators by using higher order polynomial functions in place of the $3^{rd}$ order polynomial function 1220, the process of which is apparent to one of ordinary skill in the art.

Linear filters 910A-N and 1210A-N implement factored Volterra kernels which are measured via harmonic probing. Harmonic probing is implemented by injecting known multi-tone test signals into the ADC input. In a preferred embodiment of the invention, the number of tones needed is greater than or equal to the order of the kernel (e.g., greater than or equal to 3-tones for a third-order kernel). The frequency of each test tone is selected to minimize (or eliminate) overlapping components, e.g., harmonics do not have the same frequency as the fundamental tone. Overlapping measurements can be discarded so that only non-overlapping measurements are employed. More tones can be used than required for fewer test signals (e.g., using 3-tone test signals to measure second- and third-order kernels), with the same constraints on overlapping components. Test frequencies are selected to be centered on FFT bins (e.g., prime-coherent sampling) and all combinations are chosen to cover the full N-dimensional frequency space (e.g., for 3-tone combinations, each tone covers the desired frequency range and are calculated, for example, with embedded for-loops for each tone). Symmetry of the Volterra kernels reduces the required number of tone combinations. The amplitude of the test signals are preferably set to near full scale, i.e., saturation, of system where the distortion is most prominent.

In an alternative embodiment of the invention, test frequencies are selected randomly for uniform coverage over the N-dimensional frequency space. Test signals with too many overlapping components may be discarded. In order to prevent introduction of external non-linear distortion, high-linearity signal combiners are employed and the signal generator outputs' harmonic distortion is filtered via low-pass or band-pass filters.

A frequency domain Volterra kernel is analogous to a multi-dimensional linear filter where the input is $$X_n[k_1, k_2, \ldots, k_n] = X[k_1] * X[k_2] \ldots * X[k_n]$$

and the output is an n-dimensional convolution of input $$X_n(z_1, z_2, \ldots, z_n) = X_n(z_1) X_n(z_2) \ldots X_n(z_n)$$

with n-dimensional Volterra kernel $H_n(z_1, z_2, \ldots, z_n)$. The one-dimensional output in the time domain is the diagonal of n-dimensional output $y_n(k, k, \ldots k)$.

Since multi-tone sinusoidal inputs in time-domain correspond to dirac delta functions in frequency-domain, the frequency response of the Volterra kernel $H_n(z_1, z_2, \ldots z_n)$ is effectively sampled at the multi-tone frequencies by using multi-tone sinusoidal test signals. The complex frequency response of the one-dimensional output is calculated, for example, with a one-dimensional FFT and evaluated at the frequencies of the harmonics and intermodulation distortion components (i.e., the "sum" frequencies). Care must be taken to appropriately scale the amplitude of the complex frequency response if some of the frequencies in the multi-tone sinusoidal test signal are repeated. This process is repeated for multiple multi-tone sinusoidal such that the Volterra kernel $H_n(z_1, z_2, \ldots z_n)$ is cataloged for many frequencies over the desired bandwidth.

Figure 14:
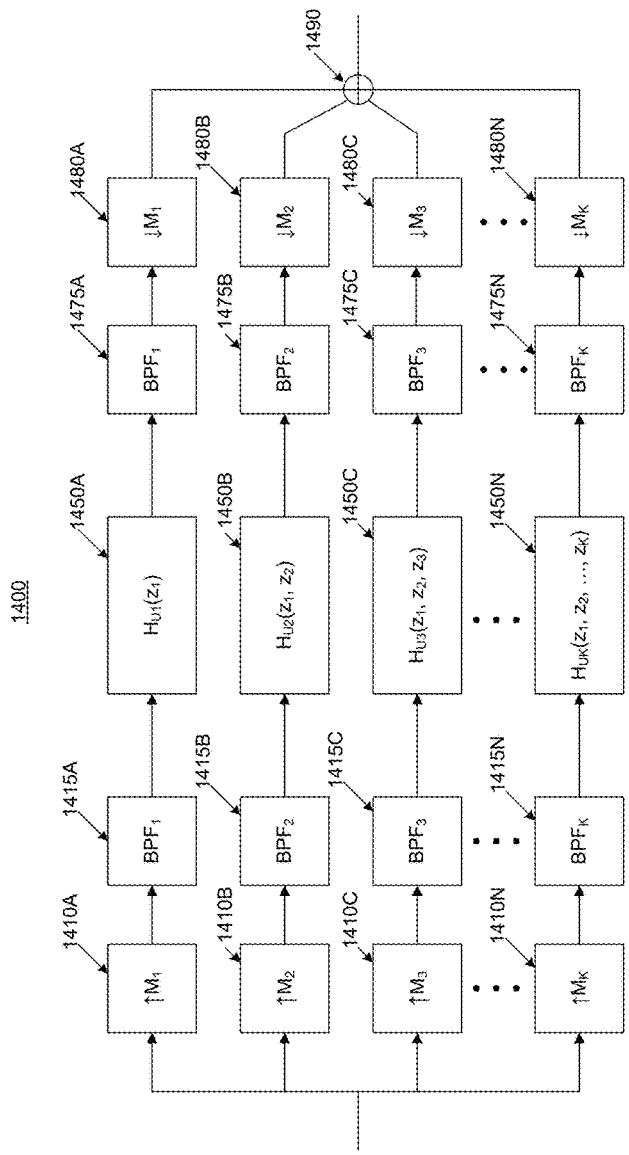
FIG. 14 illustrates a block diagram of a multirate Volterra compensator according to an embodiment of the invention.

FIG. 14 illustrates an alternate embodiment of the invention where a multirate Volterra compensator 1400 is operated at a sample rate that is commensurate with the bandwidth of the nonlinear distortion that is being modeled. For example, if the maximum frequency in the desired band is $f_1$ and the maximum order of the compensator is 3, then the maximum frequency of the nonlinear distortion is the third harmonic at $3f_1$. Therefore, the factored Volterra compensator can be operated at a minimum sample rate of $6f_1$ to properly resolve the bandwidth of the modeled distortion components according to the Nyquist theorem. Bandpass interpolation is implemented using upsamplers 1410A-N and bandpass filters 1415A-N and can be used to appropriately increase the sample rate of the multirate Volterra compensator. Increasing the sample rate of the compensator has the effect of only utilizing particular subbands of the upsampled Volterra filters 1450A-1450N since nonlinear distortion components will not fall at all possible frequencies.

The upsampled Volterra filters 1450A-1450N can correspond to multi-dimensional upsampled Volterra kernels, where a non-upsampled Volterra filter is "zero-stuffed" by a factor of $M_k$ (i.e., $M_k$ zeroes are inserted between adjacent Volterra kernel coefficients in a multi-dimensional sense). This process is called multidimensional upsampling by those skilled in the art. In the frequency domain, the upsampled Volterra filter accurately approximates the desired frequency response in the active subbands, and this frequency response is simply repeated (with conjugate symmetry) in the inactive or "do not care" bands. Since only a subset of Volterra kernel coefficients are non-zero, this greatly simplifies the Volterra filter design algorithm (described below) and greatly reduces the size of the hardware implementation (since the many zero coefficients correspond to simple time delays instead of full multipliers).

For many applications, the bandwidth of the system is limited. Bandpass decimation is implemented with bandpass filters 1475A-N and downsamplers 1480A-N and may optionally be used to limit the bandwidth of the compensation signal and reduce the sample rate. This greatly reduces the processing resources required by significantly reducing the data rate.

Figure 15:
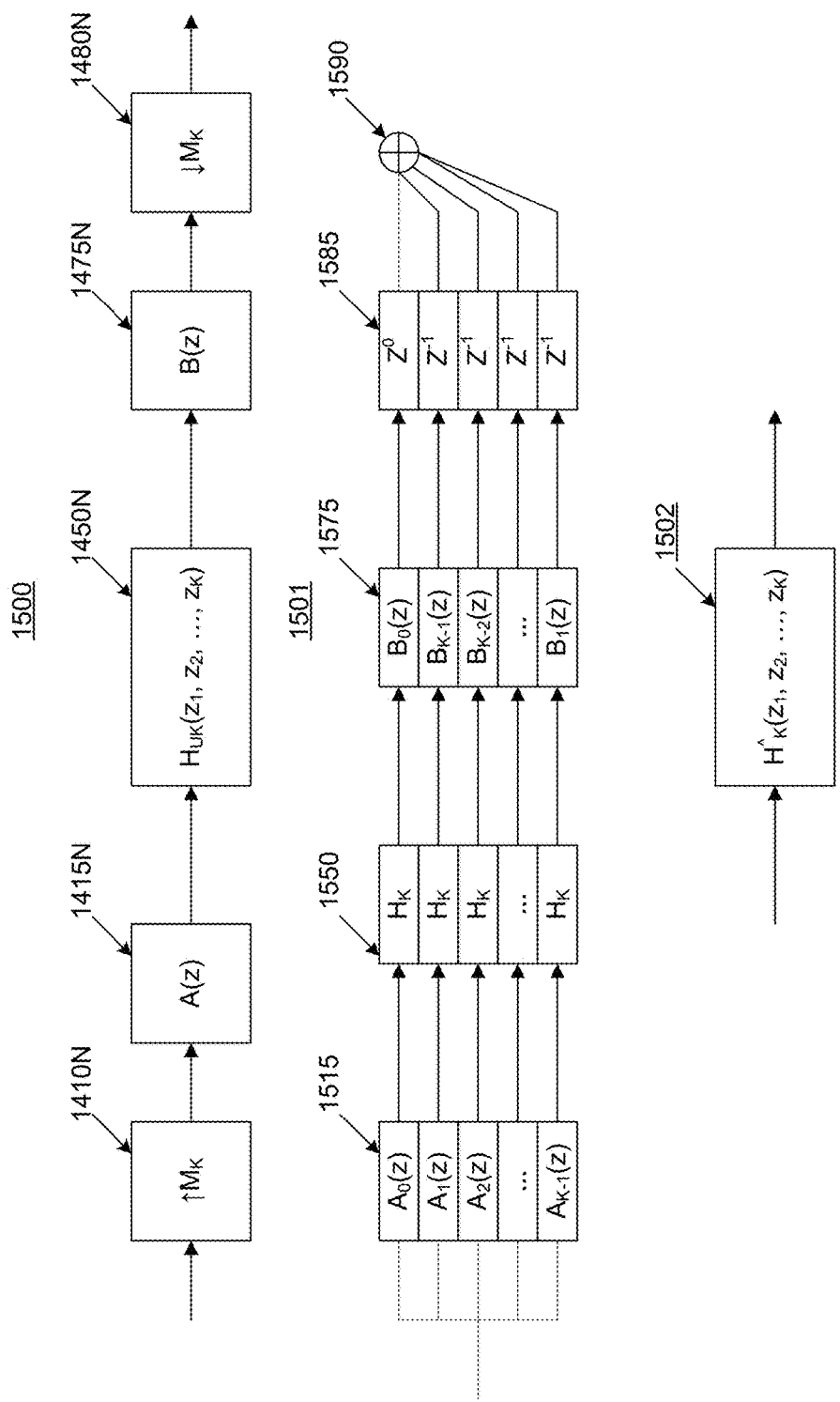
FIG. 15 illustrates a block diagram of a polyphase Volterra compensator and equivalent Volterra compensator according to embodiments of the invention.

FIG. 15 depicts a preferred embodiment of the invention where the multi-rate Volterra compensator 1400 is implemented in an efficient polyphase Volterra configuration 1501. A generalized version of the $k^{th}$ order processing arm shown in FIG. 14 including upsampler 1410N, bandpass filter 1415N, upsampled $k^{th}$ order Volterra filter 1450N, bandpass filter 1475N, and downsampler 1480N is shown as 1500 in FIG. 15. The processing arm 1500 in FIG. 15 is more general than that of FIG. 14 since it optionally allows the bandpass filter A(z) 1410N to be different than the bandpass filter B(z) 1475N.

In this preferred embodiment of the invention, the polyphase Volterra filter 1501 in FIG. 15 is used, which is mathematically equivalent to the $k^{th}$ order processing arm 1500. The polyphase Volterra filter 1501 includes polyphase bandpass filters 1515, downsampled Volterra filters 1550, polyphase bandpass filters 1575, and delays 1585 and a summer 1590. The polyphase bandpass filters 1515 and 1575 are the $M_k$ polyphase components of the filters A(z) 1410N and B(z) 1480N respectively, which are readily determined by one skilled in the art. The downsampled Volterra filters 1550 correspond to the non-zero kernel coefficients of the upsampled Volterra filter 1450N; in other words, the Volterra filters 1550 are multidimensionally downsampled by $M_k$ to remove the added zeros in the upsampled Volterra filters 1450N. The polyphase Volterra filter 1501 is significantly more efficient to implement in hardware than the processing arm 1500 since it is processed at the lower (i.e., non-upsampled) data rate. This corresponds to a smaller, lower power, lower cost hardware implementation.

In an alternate embodiment of the invention, an equivalent Volterra filter $\widehat{H_k}$ 1502 may optionally be used. The cascade of each polyphase bandpass filter 1515, downsampled Volterra filter 1550, and polyphase bandpass filter 1575 is mathematically equivalent to the multidimensional convolution of the tensor outer product of the polyphase bandpass filters 1515, the downsampled Volterra filter 1550, and a multidimensional diagonal matrix containing the coefficients of the polyphase bandpass filter 1575. This property allows the polyphase Volterra filter 1501 to be optionally be implemented in a single, equivalent Volterra filter 1502. This equivalent Volterra filter 1502 can then be factored and simplified into a set of parallel FIR filters as described below for an efficient hardware implementation.

Figure 16:
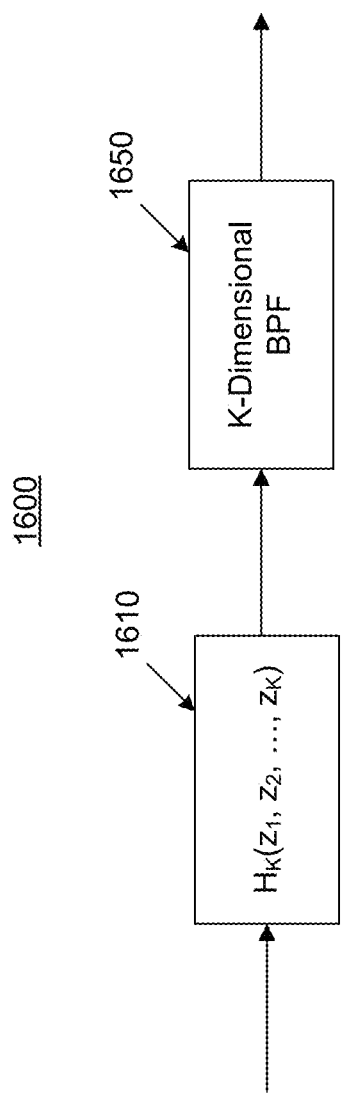
FIG. 16 illustrates a block diagram of a Volterra compensator with a K-dimensional bandpass filter according to an embodiment of the invention.

FIG. 16 illustrates an another alternate embodiment of the invention where an arbitrary Volterra filter 1610 is convolved with a multidimensional bandpass filter 1650 to attenuate high-frequency intermodulation distortion components that would otherwise exceed the Nyquist criterion and cause aliasing errors. The purpose of the multi-rate Volterra filtering techniques discussed above is to unambiguously resolve these super-Nyquist frequency components through bandpass interpolation, which effectively increases the sample rate such that the frequency of these components now satisfy the Nyquist criterion. However, the multi-dimensional Volterra filter has the ability to properly and unambiguously resolve the frequency response of these high frequency components itself without any sample rate increase since the extra dimensions of the filter have the necessary mathematical degrees of freedom. Without any sample rate increase, these super Nyquist components can otherwise cause aliasing. Aliasing of high frequency non-linear distortion is commonplace with devices such as analog-to-digital converters, so this is a very useful and efficient property of the Volterra filter in those cases.

However, for devices such as radio frequency power amplifiers, high frequency distortion components are not subject to aliasing since they are analog, continuous-time devices. In these cases, a multidimensional, preferably linear phase, bandpass filter 1650 is designed (using standard linear phase filter design techniques familiar to those skilled in the art) to attenuate the out-of-band distortion components and prevent aliasing errors. The multidimensional bandpass filter 1650 is convolved with the original Volterra filter 1610 to produce a new bandpass Volterra filter 1600 without aliasing errors. This allows the use of a small size original Volterra filter 1610, whose coefficients can be estimated more quickly and with less processing resources while accurately approximating the desired frequency response. Then this Volterra filter 1610 is augmented by multi-dimensional convolution with an appropriate multidimensional bandpass filter 1650 to prevent aliasing errors. This bandpass Volterra filter 1600 can then be factored and simplified into a set of parallel FIR filter as described below for an efficient hardware implementation.

Referring back to FIG. 14, an alternate embodiment of the invention does not use the upsamplers in 1410A-N. This oversampled compensator system is configured to operate on a bandlimited subband that is a portion of the full Nyquist bandwidth of the system and such that the high frequency distortion does not violate the Nyquist criterion and therefore no aliasing occurs. For example, a power amplifier pre-distortion linearization compensator is operated at a sample rate of 3 GHz but the desired band to compensated is only zero to 200 MHz and the highest order to be compensated is the fifth order. The highest frequency distortion components can appear at no greater than 1000 MHz, which is within the 1.5 GHz Nyquist zone of the system. Therefore no upsampling is necessary since the system is already free of aliasing because it is oversampled.

In this alternative embodiment, the oversampled compensator system uses upsampled Volterra filters 1450A-1450N. As previously mentioned, since only a subset of Volterra kernel coefficients are non-zero, this greatly reduces the size of the hardware implementation since the many zero coefficients correspond to simple time delays instead of full multipliers. Furthermore, the bandpass decimators 1480A-N may be implemented digitally or, alternatively, analog bandpass filters may used to limit the bandwidth of the desired compensation signal.

The efficiency of the measurement of the Volterra kernels is greatly simplified due to the symmetry of the Volterra kernels, $h_n[k_1, k_2, \ldots k_n]$. The kernels $h_n[k_1, k_2, \ldots k_n]$ are equal for all permutations of $k_1, k_2, \ldots k_n$. This leads to very symmetric kernels in both the time-domain and the frequency-domain and super-symmetric factorization, which is described below.

To account for parameters that may drift over time and temperature, the device or system being compensated can be taken offline periodically for recalibration using the multi-tone harmonic probing approach discussed above.

In an alternate embodiment of the invention, the system can be adaptively calibrated in accordance with methods described above. In addition, correlation techniques can be used to estimate Volterra kernels for arbitrary inputs. Orthogonal factorizations of the Volterra kernels can be used for statistical independence, thereby simplifying the correlation measurements. The adaptive calibration can intelligently update factory calibration measurements and combine measurements over time, temperature, signal content, etc. as described above.

In a preferred embodiment of the invention, the calculation of Volterra kernel coefficients is performed with an over-constrained linear least mean squares filter design with filter weighting. A matrix of Volterra kernel coefficients is scaled by the measured complex frequency response. The real and complex parts are evaluated and subtracted from the measurement. This process is repeated for at least as many measurements as there are unique Volterra kernel coefficients. The kernel coefficients are calculated with an over-constrained least-squares solution with optional weighting of the form $$WAx = Wb,$$

Where W is the weighting function (to optionally weight certain measurements or frequencies), x is a vector of estimates of the time-domain Volterra kernel, b is a vector of real and imaginary frequency response measurements, and A is a matrix corresponding to the frequencies of each measurement. The solution for the optimal Volterra kernel x via the over-constrained least-squares problem is $$x = \text{inv}(A'W'WA)A'W'Wb)$$

This represents a very efficient, non-iterative solution via matrix algebra. Weighting is used to help ignore bands where signals will never fall. This approach can be extended to a MINIMAX (minimize maximum error signal) by iteratively adjusting the weighting of each measured frequency by a factor proportional to its amplitude. Therefore, larger amplitude error signals will get a higher weighting. The iteration is continued until it converges to the MINIMAX solution.

In an alternate embodiment of the invention, the calculation of Volterra kernel coefficients is performed via interpolation and extrapolation to uniform frequencies such that the computationally-efficient inverse Fourier transform can be used to estimate the kernel. Data at measured frequencies can be interpolated and extrapolate (e.g., using a cubic spline) to a set of uniformly-spaced frequencies corresponding to those of a Fast Fourier Transform (FFT). The inverse FFT translates these frequency-domain measurements to time-domain Volterra kernels. Forcing conjugate symmetry in the FFT measurements insures that real-valued (not imaginary) coefficients will be calculated for the Volterra kernels. Most stable, realistic systems exhibit fading memory where the amplitudes of the Volterra kernels decrease to negligible levels as the Volterra matrix gets larger. This inverse FFT filter design method can be used to easily calculate very large Volterra matrices, much longer than the anticipated fading memory size. A large inverse FFT also avoids frequency aliasing which could otherwise decrease the accuracy of the calculated Volterra kernel coefficients. A subset of the Volterra kernel can be selected by windowing the matrix centered on the maximum magnitude kernel coefficients. However, this method does not have a frequency weighting capability, so it may not be the optimal solution for a different error criterion. In that case, it may be used as starting point for other optimizations, such as an iterative solution.

In another alternate embodiment of the invention, the calculation of Volterra kernel coefficients is performed via an iterative linear or non-linear optimization. Volterra kernel coefficients can be iteratively adjusted and compared in a mean squares sense to the measured data, and the iteration continues until it converges to a solution.

For higher-order implementations of the factored Volterra compensator (i.e., order greater than 3), it becomes necessary to discriminate between overlapping kernels. Higher-order kernels have overlapping frequency components with lower-order kernels (e.g., some fifth-order intermodulation components are the same frequency as the third-order intermodulation components). In a preferred embodiment of the invention, the higher-order kernels can be measured at non-overlapping frequencies, followed by measuring the lower-order kernels by subtracting out overlapping components. In an alternate embodiment, kernels can be measured at multiple signal amplitudes and the different orders can be discriminated by their variations in amplitude (e.g., if the input amplitude is lowered by 1 dB, then the third-order components are reduced by 3 dB and the fifth-order components are reduced by 5 dB).

While it is possible to implement Volterra kernels as brute force multiplication and addition of all components, this is a very inefficient method requiring impractical amounts of processing resources, large size, high power consumption, and high cost. In an embodiment of the invention, the Volterra kernel is factored into dominant components and a very accurate but efficient implementation of the kernel is performed by implementing only the most significant components. Insignificant factors can be ignored to significantly reduce the size with negligible impact on the performance. A factorization (also called decomposition) method called Singular Value Decomposition (SVD) is effective for second-order Volterra kernels, and a factorization method called Tucker Decompositions is effective for higher-order Volterra kernels (i.e., $3^{rd}$ order and greater). As discussed above, symmetry of the Volterra kernel leads to super-symmetric factorizations, which are extremely efficient. Note that these factorizations are exact implementations of the Volterra kernel if all factorization components are implemented. However, the benefit of the factorizations is the ability to decompose the Volterra kernels into its factors, rank the factors by the significance of their contribution, and elect to implement the most significant factors necessary for the desired level of performance.

In an embodiment of the invention, the Volterra kernels are implemented as a parallel filter bank followed by a memoryless nonlinear combination of polynomials. If the memory of Volterra kernel is L (i.e., $h_n$ is an L×L×L× . . . tensor), then there are at most L filters in the parallel filter bank, each with L coefficients. The maximum number of memoryless nonlinear combination is $L^k$ (L=memory, k=Volterra order). The coefficients are quantized for implementation in efficient fixed-point arithmetic. In an alternate embodiment of the invention, the implementation can be floating point arithmetic for improved accuracy but requiring more processing resources.

In a preferred embodiment of the invention, the Volterra kernels can be factored by implementing only the dominant diagonals and off-diagonals of Volterra kernel matrices. Often, the dominant energy in the Volterra kernel is concentrated on a few diagonals, so this factorization method can provide high accuracy with low computational complexity. A key to significantly reducing the complexity of implementing the Volterra filtering is to exploit the extreme symmetry inherent in the Volterra kernels, namely, $h_m[k_1, k_2, \ldots, k_m]$ are identically equal for all permutations of $[k_1, k_2, \ldots, k_m]$. This dramatically reduces the implementation complexity from $K^m$ total coefficients to $$\binom{K+m-1}{m}$$

unique coefficients. For example, a fifth-order Volterra kernel (m=5) with memory K=8 has 32,768 total coefficients, of which 792 are unique (a reduction of over 97%).

The unique, symmetric coefficients correspond to the diagonal and upper off-diagonal coefficients of the multi-dimensional Volterra kernels (which are matrices for two-dimensional kernels and tensors for higher order kernels greater than second order). Each diagonal and off-diagonal component can be efficiently implemented as an FIR filter. Each FIR filter can be rank-ordered by a measure of the energy in each (e.g., the sum of the squares of the filter coefficients). To reduce the complexity of the implementation, an accurate approximation of the Volterra kernel can be implemented by retaining only the FIR filters with energy above a prescribed threshold.

Figure 17:
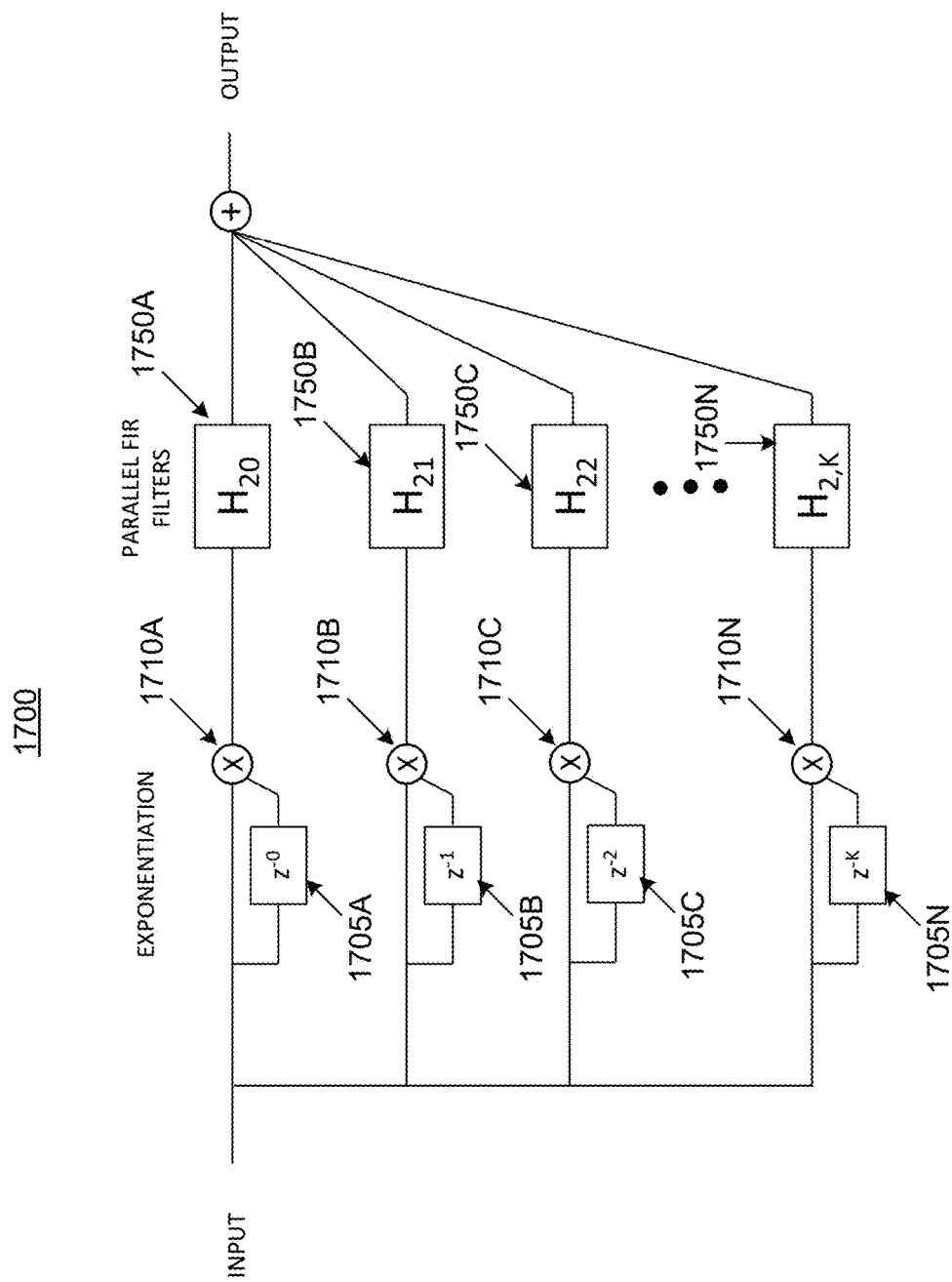
FIG. 17 illustrates the structure of the second-order factored Volterra compensator according to a preferred embodiment of the invention.

FIG. 17 depicts a preferred embodiment of the invention where the second-order Volterra kernel 1700 is implemented with second-order exponentiators 1710A-N and parallel FIR filters 1750A-N. The parallel FIR filters correspond to the unique diagonal and upper off-diagonal coefficients of the Volterra kernel. The exponentiators 1710A-N are implemented with two-input multipliers whose inputs correspond to the Volterra filter input and a delayed version of the Volterra filter input using delays 1705A-N. The diagonal of the Volterra kernel corresponds to the case where the delay 1705A is zero, the first upper off-diagonal of the Volterra kernel corresponds to the case where the delay 1705B is one, and likewise for the other upper off-diagonals.

Figure 18:
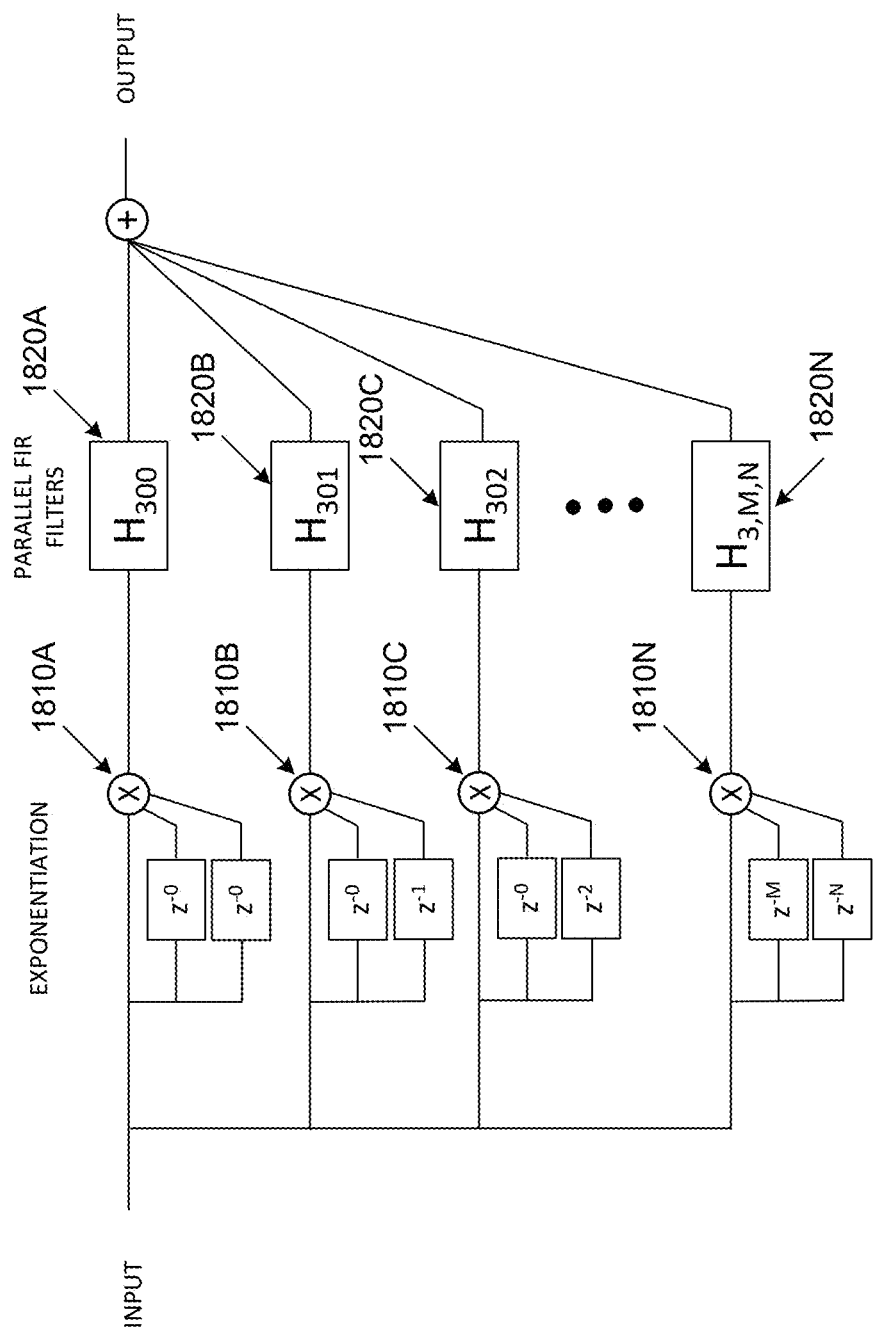
FIG. 18 illustrates the structure of the third-order factored Volterra compensator according to a preferred embodiment of the invention.

Similarly, FIG. 18 depicts a preferred embodiment of the invention where the third-order Volterra kernel is implemented with third-order exponentiators 1810A-N and parallel FIR filters 1850A-N. Again, the parallel FIR filters correspond to the unique diagonal and upper off-diagonal coefficients of the Volterra kernel. The exponentiators 1810A-N are implemented with three-input multipliers whose inputs correspond to the Volterra filter input and a delayed versions of the Volterra filter. This same structure is readily extended to higher order Volterra kernels for similarly efficient implementations of arbitrary order Volterra filters.

For very wideband applications, the second-order FIR filters 1720A-N in FIG. 17 can be implemented as previously described and shown in FIG. 10 in a parallel polyphase configuration 1100 at a significantly reduced sample rate. Without this parallelization of the processing into numerous lower data rate paths, the extremely fast data rate would be beyond the capabilities of realizable hardware, such as digital signal processors (DSP), field programmable gate arrays (FPGA), or application specific integrated circuits (ASIC). Such parallelization may be implemented, for example, as polyphase finite impulse response (FIR) filters, the implementation of which is readily apparent to one of ordinary skill in the art. The third-order FIR filters 1820A-N in FIG. 18 and higher-order FIR filters (not shown) can be similarly implemented in a parallel polyphase configuration.

Once the Volterra kernels have been factored, they are rank ordered according to their significance (e.g., their singular values, Tucker factors, or other measurement of the relative energy in the Volterra kernel). Factored components are progressively included in the implementation until a desired level of performance or computational complexity limit has been reached. Once the Volterra kernels have been decomposed into their dominant factors, the compensation system for weakly nonlinear systems (i.e., a system where the nonlinear distortion is much, much smaller than the fundamental signals) is implemented by negating the Volterra kernels above the first order. The first order term passes the fundamental signal through the compensator in phase, and the kernels above the first order are negated such that they are subtracted from the output, thereby canceling the nonlinear distortion.

Figure 19:
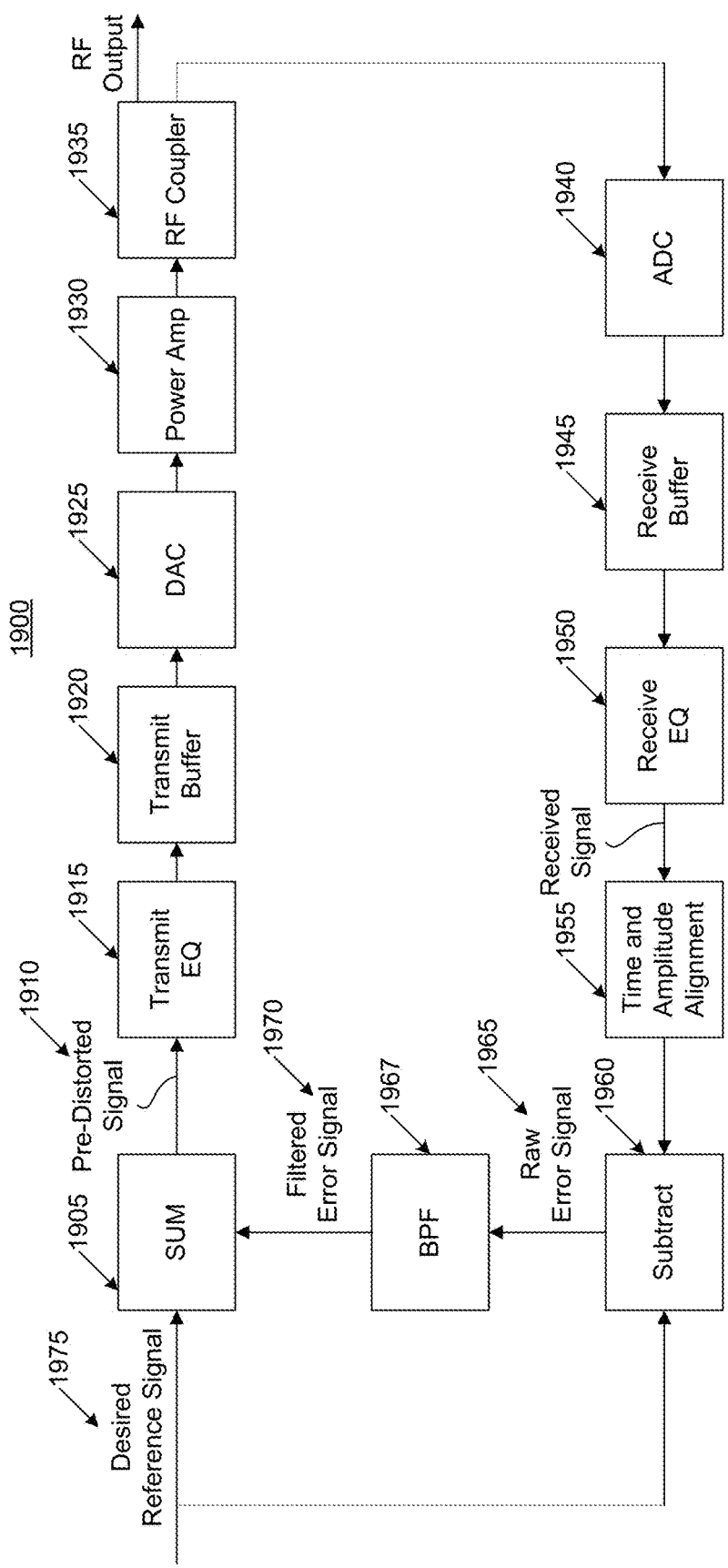
FIG. 19 illustrates a compensator calibration system.

To determine the appropriate Volterra kernel for a strongly nonlinear system (i.e., a system where the nonlinear distortion is roughly the same order as the fundamental signals), a preferred embodiment of the invention uses an iterative calibration algorithm 1900 to converge to a suitable result, as shown in FIG. 19. The iterative algorithm uses a series of multi-tone calibration signals with frequencies appropriately chosen to avoid overlapping distortion components, as described previously. Other non-sinusoidal signal types, such as pseudo-random, bandpass, spread spectrum or other modulated waveforms may also be used with this method.

During system calibration for a strongly nonlinear pre-compensation system such as digital pre-distortion of RF power amplifiers, for each calibration signal, the desired signal 1975 is iteratively adjusted to create a pre-distorted signal 1910 such that, when distorted by the RF power amplifier 1930, the output of the power amplifier 1930 closely matches the desired signal 1975.

The desired signal 1975 is digitally generated (e.g., on a computer or in an in-system embedded processor) and, on the first iteration of the algorithm, stored in a transmit buffer memory 1920 and converted to an analog signal with a digital-to-analog converter 1925. This signal is amplified by the RF power amplifier under test 1930 and the amplifier output is coupled with an RF coupler 1935 to an analog-to-digital converter 1940. The analog-to-digital converter output is captured in receive buffer memory 1945. The received signal 1952 accurately represents the output of the RF power amplifier 1930. The gain and delay of the received signal 1952 is adjusted in block 1955 (described further below) and compared to the desired signal 1975 via subtraction 1960 to create error signal 1970. On the second and subsequent iterations of the algorithm, the error signal 1970 is added to the desired signal 1975 with summer 1905 to create a new pre-distorted signal 1910. The process is repeated until the level of the error signal 1970 is below a prescribed threshold, indicating that the algorithm has converged to an appropriate solution. Once this occurs, both the desired signal 1975 and the final pre-distorted signal 1910 are saved in memory and the process is optionally repeated for another calibration signal.

The time and amplitude alignment block 1955 includes a digital gain element (e.g., a digital multiplier) to compensate for the gain of the RF power amplifier and a delay adjustment (e.g., delay elements) to compensate for the time delay of the DAC 1925 and transmit electronics (not shown), RF power amplifier 1930, RF coupler 1935, ADC 1940 and receive electronic (not shown).

In an alternate embodiment of the invention, the iterative calibration algorithm shown may optionally include a DAC equalization filter 1915 to compensate for any amplitude and phase distortion caused by the digital-to-analog converter and associated transmit electronics. The transmit electronics may include RF filters or mixers (not shown) to change the frequency of the transmitted signal. The algorithm may also optionally include an ADC equalization filter 1950 to compensate for any amplitude and phase distortion caused by the analog-to-digital converter and associated receive electronics. The receive electronics may include RF filters or mixers (not shown) to change the frequency of the received signal. The algorithm may optional include a bandpass filter 1967 to limit the bandwidth of the correction signal to a prescribed frequency band.

Figure 13:
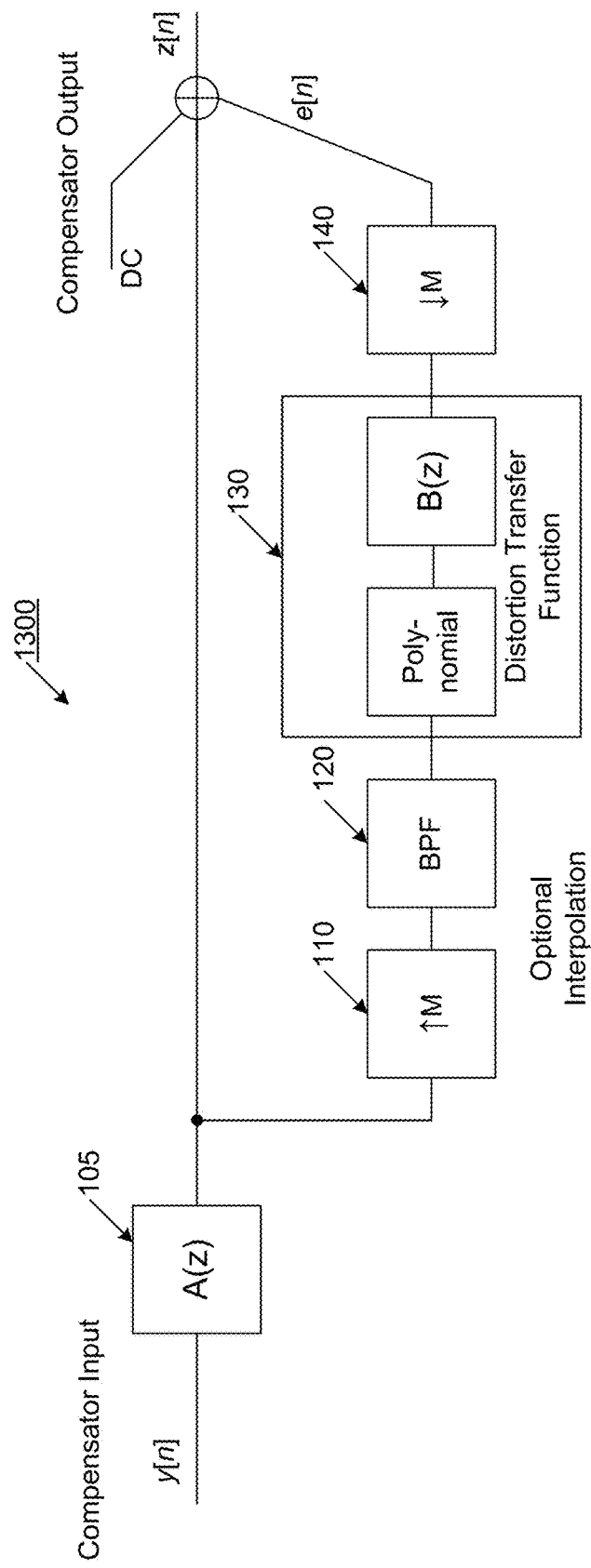
FIG. 13 depicts a distortion compensator where a subset of the full Volterra kernel is implemented in a Linear-Nonlinear-Linear (LNL) Hammerstein-Wiener non-linear error compensation model.

In a preferred embodiment of the invention, once the iterative algorithm has been used with a multiplicity of calibration signals, the saved sets of corresponding desired signals 1975 and pre-distorted signals 1910 are used with the harmonic probing process previously described to determine the appropriate Volterra kernel or kernels. These Volterra kernels represent the pre-inverse Volterra filters that effectively compensate for the nonlinear distortion of a system such as an RF power amplifier. These Volterra filters can be efficiently implemented in hardware using the factorization techniques previously described. FIG. 13 depicts an alternate embodiment of the invention, where a subset of the full Volterra kernel is implemented in a Linear-Nonlinear-Linear (LNL) Hammerstein-Wiener non-linear error compensation model. This model exercises much more of Volterra kernel than just Hammerstein or Wiener model by itself and is much more efficient than full Volterra implementation. The LNL compensator 1300 is an alternate embodiment of the distortion compensator 100 shown in FIG. 1. Referring back to FIG. 13, the LNL compensator comprises a first linear filter 105 which provides a fundamental signal path and a compensator signal path. The compensator signal path includes a distortion transfer function 130, which is comprised of a nonlinear polynomial 133 and a second linear filter 137. The fundamental signal path and the compensator signal path are summed via an adder to provide the compensator output, labeled z[n] in the figure. Optionally, the compensator path may include a bandpass interpolator, which is comprised of an upsampler 110 and a bandpass filter 137. The bandpass interpolator is used to resolve super-Nyquist distortion components. This option also includes a downsampler 140 to re-establish the original sample rate.

Measurement of the LNL kernel coefficients (i.e., the filter coefficients for linear filters 105 and 137) is essentially identical to that of the full Volterra kernel via harmonic probing via injection of known multi-tone test signals. Unlike the full Volterra harmonic probing, 1-tone and 2-tone measurements are sufficient for measuring higher order LNL kernels (i.e., measuring the LNL coefficients does not require at least as many tones as the order of kernel). The same requirements for choosing non-overlapping test frequencies apply. The same methods for measuring the complex frequency response at the sum frequencies using FFTs and cataloging the frequency response for many frequencies over the desired bandwidth applies. Similarly, in one alternate embodiment of the invention, the LNL compensator is operated at a sample rate that is commensurate with the bandwidth of the nonlinear distortion that is being modeled.

The equivalent Volterra kernel for the LNL compensator has the same Volterra symmetry, i.e., the equivalent kernels $h_n[k_1, k_2, \ldots k_n]$ are equal for all permutations of $k_1, k_2, \ldots k_n$. This leads to very symmetric kernels in both the time-domain and the frequency-domain and super-symmetric factorization. The equivalent Volterra kernel for the LNL compensator (i.e., the system with two FIR filters a[n] 105 and b[n] 137 separated by a polynomial operator, such as squaring or cubing) is the two-dimensional convolution of (a[n]'*a[n]) and a diagonal matrix that is comprised of the coefficients of b[n] as its diagonal components. The equivalent Volterra kernel frequency response is $A(z_1)A(z_2)B(z_1z_2)$ for second order, $A(z_1)A(z_2)A(z_3)B(z_1z_2z_3)$ for third-order, and so on for higher order.

One method for measuring the coefficients of the first FIR filter a[n] 105 is with the injection of single-tone test signals with known frequency and phase. The transfer function (amplitude and phase) is measured by comparing the output amplitude and phase to the input amplitude and phase. A set of linear filter coefficients are fit to the measured transfer function using standard filter design techniques.

The same methods for recalibration of the Volterra kernel apply to the LNL compensator (i.e. periodic recalibration or adaptive background calibration). Several methods are available for the calculation of the filter coefficients for the LNL compensator. One method is an iterative non-linear optimization that uses a least mean squares curve fitting of the system to measured data (real and complex parts for both filters simultaneously). This method can be augmented with iterative filter weighting, for example, for MINIMAX optimizations. Another method optimizes the second filter, b[n], using previously described MINIMAX techniques and given a previous measurement of the first filter (a[n]). Another method is a mathematical projection of the full Volterra kernel into the LNL filter space. An unconstrained Volterra kernel is calculated with methods described above, and this solution is optimally projected given the available computational constraints of the LNL system.

As noted above, the LNL compensator is implemented as two FIR filters 105 and 107 with a memoryless polynomial nonlinearity 132 between the filters. The above filter design techniques are used to calculate the required filter coefficients, which can be truncated or windowed to extract the dominant coefficients. The coefficients can be quantized for an efficient fixed-point arithmetic implementation. The gain and linear delay of the system can be seamlessly shifted between the two filters with no practical effect on the overall response of the system.

The present invention is applicable to a wide range of military and commercial applications including, but not limited to: advanced radar systems; software-defined radios; multi-beam adaptive digital beamforming array transceivers, smart radios for wireless communications (terrestrial and satellite); wideband electronic warfare transceivers; general test equipment such as oscilloscopes, spectrum analyzers, and network analyzers; special test equipment, wide bandwidth modems, anti-jam global positioning system (GPS) receivers, and active radar for Earth science measurements.

The invention has been described herein using specific embodiments for the purposes of illustration only. It will be readily apparent to one of ordinary skill in the art, however, that the principles of the invention can be embodied in other ways. Therefore, the invention should not be regarded as being limited in scope to the specific embodiments disclosed herein, but instead as being fully commensurate in scope with the following claims.

I claim:

1. A multi-rate Volterra compensator for removing nonlinear distortion introduced by an electronic system, the multi-rate Volterra compensator comprising:
    a number, k, of processing arms interconnected in a parallel configuration, wherein k is equal to a maximum order of the multi-rate Volterra compensator and is greater than one; and wherein
    for each kth order processing arm,
        an upsampler for increasing a sampling rate of the multi-rate Volterra compensator's input by a factor of $M_k$, wherein the increased sample rate is commensurate with a bandwidth of the nonlinear distortion;
        a first bandpass filter coupled to an output of the upsampler, and
        an upsampled Volterra filter coupled to an output of the first bandpass filter, wherein each kth order processing arm removes a different order of nonlinear distortion.

2. The multi-rate Volterra compensator of claim 1, wherein each kth order processing arm further comprises
    a second bandpass filter coupled to an output of the upsampled Volterra filter, and
    a downsampler for decreasing the increased sample rate to a sample rate of the multirate Volterra compensator's input.

3. The multi-rate Volterra compensator of claim 2, wherein for each kth order processing arm, the downsampler and first bandpass filter are implemented as a first parallel polyphase bandpass filter, and the upsampled Volterra filter is implemented as a parallel downsampled Volterra filter.

4. The multi-rate Volterra compensator of claim 3, wherein for each kth order processing arm, the second bandpass filter and upsampler are implemented as a second parallel polyphase bandpass filter.

5. The multi-rate Volterra compensator of claim 4, wherein for each kth order processing arm, the first parallel polyphase bandpass filter, the parallel downsampled Volterra filter, and the second parallel polyphase bandpass filter are implemented as an equivalent Volterra filter, wherein the equivalent Volterra filter is a multidimensional convolution of a tensor outer product of the first parallel polyphase bandpass filter, the parallel downsampled Volterra filter, and a multidimensional diagonal matrix containing coefficients of the second parallel polyphase bandpass filter.

6. The multi-rate Volterra compensator of claim 2, wherein for each kth order processing arm, the upsampler, first bandpass filter, upsampled Volterra filter, second bandpass filter, and downsampler are implemented as a multidimensional bandpass filter convolved with the downsampled Volterra filter.

7. An oversampled Volterra compensator for removing nonlinear distortion introduced by an electronic system, the oversampled Volterra compensator comprising:
    a number, k, of processing arms interconnected in a parallel configuration, wherein k is equal to a maximum order of a multi-rate Volterra compensator and is greater than one; and wherein
    for each kth order processing arm, an upsampled Volterra filter operating on a bandlimited subband that is a portion of a full Nyquist bandwidth of an electronic system to remove nonlinear distortion within the bandlimited subband.

8. The oversampled Volterra compensator of claim 7, wherein each kth order processing arm further comprises:
    a bandpass filter coupled to an output of the upsampled Volterra filter, and
    a downsampler coupled to an output of the bandpass filter.

9. The oversampled Volterra compensator of claim 7, wherein each kth order processing arm further comprises an analog bandpass filter coupled to an output of the upsampled Volterra filter.

10. A Volterra compensator for removing nonlinear distortion introduced by an electronic system, the Volterra compensator comprising:
    a Volterra kernel of order N, wherein N is equal to or greater than two, wherein the Volterra kernel removes nonlinear distortion in a digital signal and is implemented in a processor comprising:

a plurality of exponentiators each operating on differently delayed inputs of the digital signal, and a plurality of parallel FIR filters.

11. The Volterra compensator of claim 10, wherein the plurality of exponentiators are second-order exponentiators.

12. The Volterra compensator of claim 10, wherein the plurality of exponentiators are third-order exponentiators.

13. The Volterra compensator of claim 10, wherein the plurality of exponentiators are fourth or higher-order exponentiators.

14. The Volterra compensator of claim 10, wherein only a subset of the plurality of parallel FIR filters with energy above a prescribed threshold are implemented.

15. The Volterra compensator of claim 10, wherein the plurality of parallel FIR filters is implemented in a polyphase configuration.

* * * * *